United States Patent
Yamazaki et al.

(10) Patent No.: US 7,402,945 B2
(45) Date of Patent: Jul. 22, 2008

(54) LIGHT EMITTING APPARATUS AND METHOD OF FABRICATING THE SAME

(75) Inventors: Shunpei Yamazaki, Tokyo (JP); Masakazu Murakami, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 49 days.

(21) Appl. No.: 10/379,123

(22) Filed: Mar. 4, 2003

(65) Prior Publication Data

US 2003/0222575 A1    Dec. 4, 2003

(30) Foreign Application Priority Data

Mar. 7, 2002    (JP)    ............................... 2002-062763

(51) Int. Cl.
*H05B 33/22* (2006.01)
*H01L 51/50* (2006.01)
*H01L 51/52* (2006.01)

(52) U.S. Cl. ........................ 313/504; 313/503; 313/506; 313/509; 257/40; 257/79

(58) Field of Classification Search ................. 313/503, 313/504, 506, 509, 511, 512
See application file for complete search history.

(56) References Cited

U.S. PATENT DOCUMENTS

| | | | |
|---|---|---|---|
| 4,356,429 A | 10/1982 | Tang | 313/503 |
| 4,411,735 A | 10/1983 | Belani | 156/659.1 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |

(Continued)

FOREIGN PATENT DOCUMENTS

EP    0 717 445 A2    6/1996

(Continued)

OTHER PUBLICATIONS

Singapore Patent Office search report re application No. 200300876-0, dated Feb. 24, 2005.

(Continued)

*Primary Examiner*—Mariceli Santiago
(74) *Attorney, Agent, or Firm*—Cook, Alex, McFarron, Manzo, Cummings & Mehler, Ltd.

(57) ABSTRACT

Although an ink jet method known as a method of selectively forming a film of a high molecular species organic compound, can coat to divide an organic compound for emitting three kinds (R, G, B) of light in one step, film forming accuracy is poor, it is difficult to control the method and therefore, uniformity is not achieved and the constitution is liable to disperse. In contrast thereto, according to the invention, a film comprising a high molecular species material is formed over an entire face of a lower electrode connected to a thin film transistor by a coating method and thereafter, the film comprising the high molecular species material is etched by etching by plasma to thereby enable to selectively form a high molecular species material layer. Further, the organic compound layer is constituted by a material for carrying out luminescence of white color or luminescence of single color and combined with a color changing layer or a coloring layer to thereby realize full color formation.

69 Claims, 15 Drawing Sheets

U.S. PATENT DOCUMENTS

| | | | |
|---|---|---|---|
| 4,885,211 A | 12/1989 | Tang et al. | 428/457 |
| 4,950,950 A | 8/1990 | Perry et al. | 313/504 |
| 5,047,687 A | 9/1991 | VanSlyke | 313/503 |
| 5,059,861 A | 10/1991 | Littman et al. | 313/503 |
| 5,059,862 A | 10/1991 | VanSlyke et al. | 313/503 |
| 5,061,617 A | 10/1991 | Maskasky | 430/569 |
| 5,063,327 A | 11/1991 | Brodie et al. | 313/482 |
| 5,073,446 A | 12/1991 | Scozzafava et al. | 428/323 |
| 5,151,629 A | 9/1992 | VanSlyke | 313/504 |
| 5,232,549 A | 8/1993 | Cathey et al. | 456/633 |
| 5,294,869 A | 3/1994 | Tang et al. | 313/504 |
| 5,294,870 A | 3/1994 | Tang et al. | 313/504 |
| 5,640,067 A | 6/1997 | Yamauchi et al. | 313/504 |
| 5,684,365 A | 11/1997 | Tang et al. | 315/169.3 |
| 5,839,456 A | 11/1998 | Han | 134/104.1 |
| 5,962,962 A | 10/1999 | Fujita et al. | 313/412 |
| 6,037,712 A | 3/2000 | Codama et al. | 313/498 |
| 6,072,450 A * | 6/2000 | Yamada et al. | 313/504 |
| 6,107,158 A | 8/2000 | Zheng et al. | 438/424 |
| 6,222,315 B1 | 4/2001 | Yoshizawa et al. | |
| 6,306,559 B1 | 10/2001 | Tanamura et al. | |
| 6,403,289 B1 | 6/2002 | Tanaka et al. | 430/329 |
| 6,420,834 B2 | 7/2002 | Yamazaki et al. | 315/169.3 |
| 6,475,836 B1 | 11/2002 | Suzawa et al. | 438/149 |
| 6,528,951 B2 | 3/2003 | Yamazaki et al. | 315/169.3 |
| 6,559,594 B2 | 5/2003 | Fukunaga et al. | |
| 6,593,691 B2 | 7/2003 | Nishi et al. | |
| 6,692,845 B2 | 2/2004 | Maruyama et al. | 428/690 |
| 6,739,931 B2 * | 5/2004 | Yamazaki et al. | 445/24 |
| 6,768,260 B2 | 7/2004 | Fukunaga et al. | |
| 6,781,152 B2 * | 8/2004 | Yamazaki | 257/59 |
| 6,781,162 B2 | 8/2004 | Yamazaki et al. | |
| 6,855,961 B2 | 2/2005 | Maruyama et al. | |
| 6,995,511 B2 | 2/2006 | Yamazaki et al. | |
| 7,101,242 B2 | 9/2006 | Fukunaga et al. | |
| 2001/0041270 A1 | 11/2001 | Maruyama et al. | 428/690 |
| 2002/0005696 A1 | 1/2002 | Yamazaki et al. | 315/169.3 |
| 2002/0015818 A1 * | 2/2002 | Takahashi et al. | 428/76 |
| 2002/0074936 A1 | 6/2002 | Yamazaki et al. | 313/504 |
| 2002/0094612 A1 * | 7/2002 | Nakamura et al. | 438/149 |
| 2002/0158835 A1 | 10/2002 | Kobayashi et al. | 345/100 |
| 2003/0132716 A1 | 7/2003 | Yamazaki et al. | 315/169.3 |
| 2003/0137325 A1 | 7/2003 | Yamazaki et al. | 327/80 |
| 2003/0162314 A1 | 8/2003 | Yamazaki et al. | 438/46 |
| 2004/0156982 A1 | 8/2004 | Maruyama et al. | 427/58 |
| 2004/0195964 A1 | 10/2004 | Yamazaki et al. | |
| 2005/0012105 A1 | 1/2005 | Yamazaki et al. | |
| 2006/0017380 A1 | 1/2006 | Fukunaga et al. | |
| 2006/0038488 A1 | 2/2006 | Fukunaga et al. | |
| 2006/0082300 A1 | 4/2006 | Yamazaki et al. | |

FOREIGN PATENT DOCUMENTS

| | | |
|---|---|---|
| EP | 0 781 075 A1 | 6/1997 |
| EP | 1 063 630 A2 | 12/2000 |
| EP | 1 168 291 A2 | 1/2002 |
| JP | 08-078159 | 3/1996 |
| JP | 08-241048 | 9/1996 |
| JP | 10-189525 | 7/1998 |
| JP | 2001-351787 | 12/2001 |

OTHER PUBLICATIONS

Tustsui, T., et al, "Electroluminescence in Organic Thin Films," Photochemical Processes in Organized Molecular Systems, pp. 437-450, (1991).

Baldo, M.A. et al, "Highly Efficient Phosphorescent Emission from Organic Electroluminescent Devices," Nature, vol. 395, pp. 151-154, Sep. 10, (1998).

Baldo, M.A. et al, "Very High-Efficiency Green Organic Light-Emitting Devices Based on Electrophosphorescene," Applied Physics Letters, vol. 75, No. 1, pp. 4-6, Jul. 5 (1999).

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504 Dec. 15, (1999).

* cited by examiner

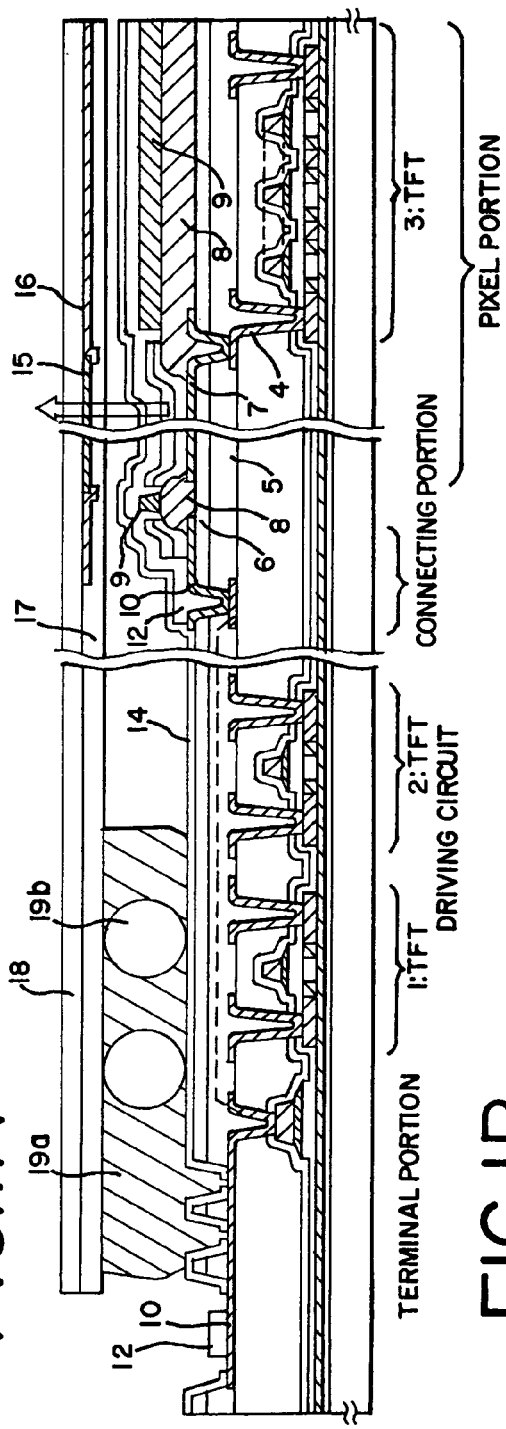
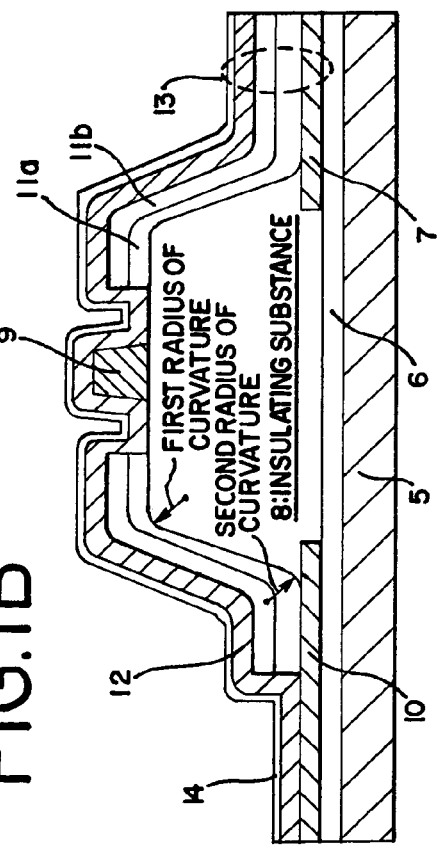

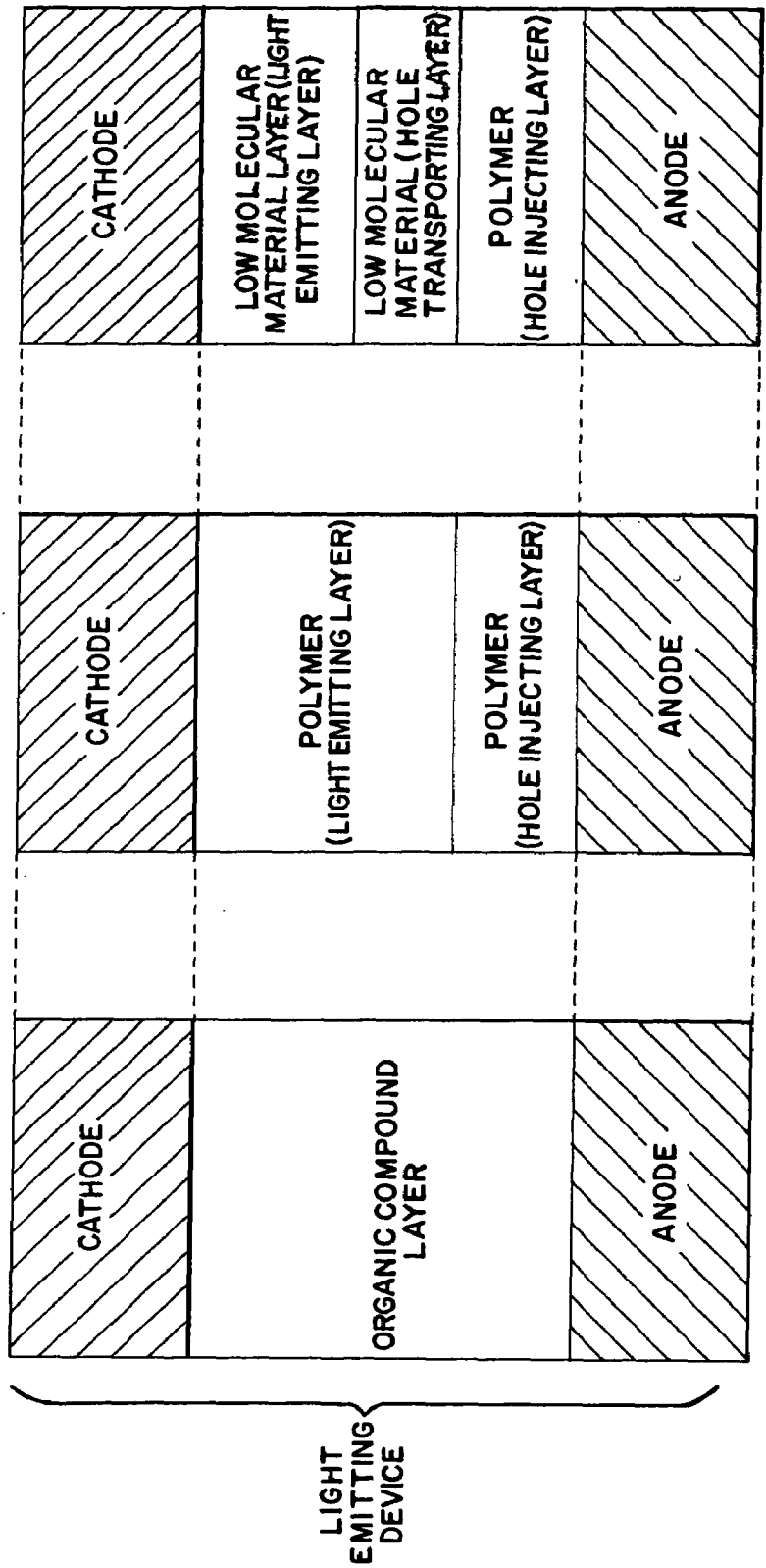

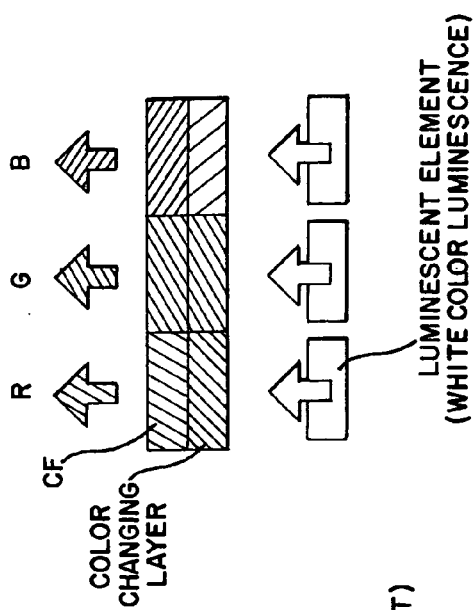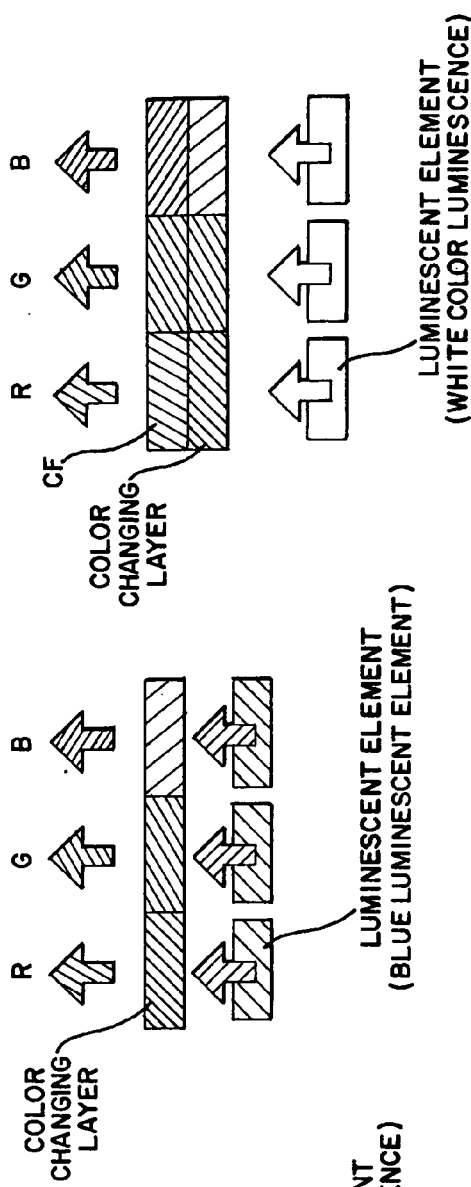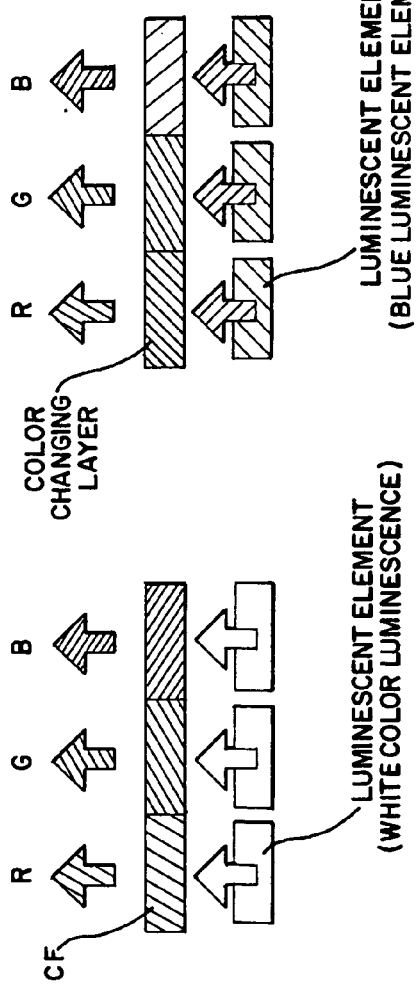

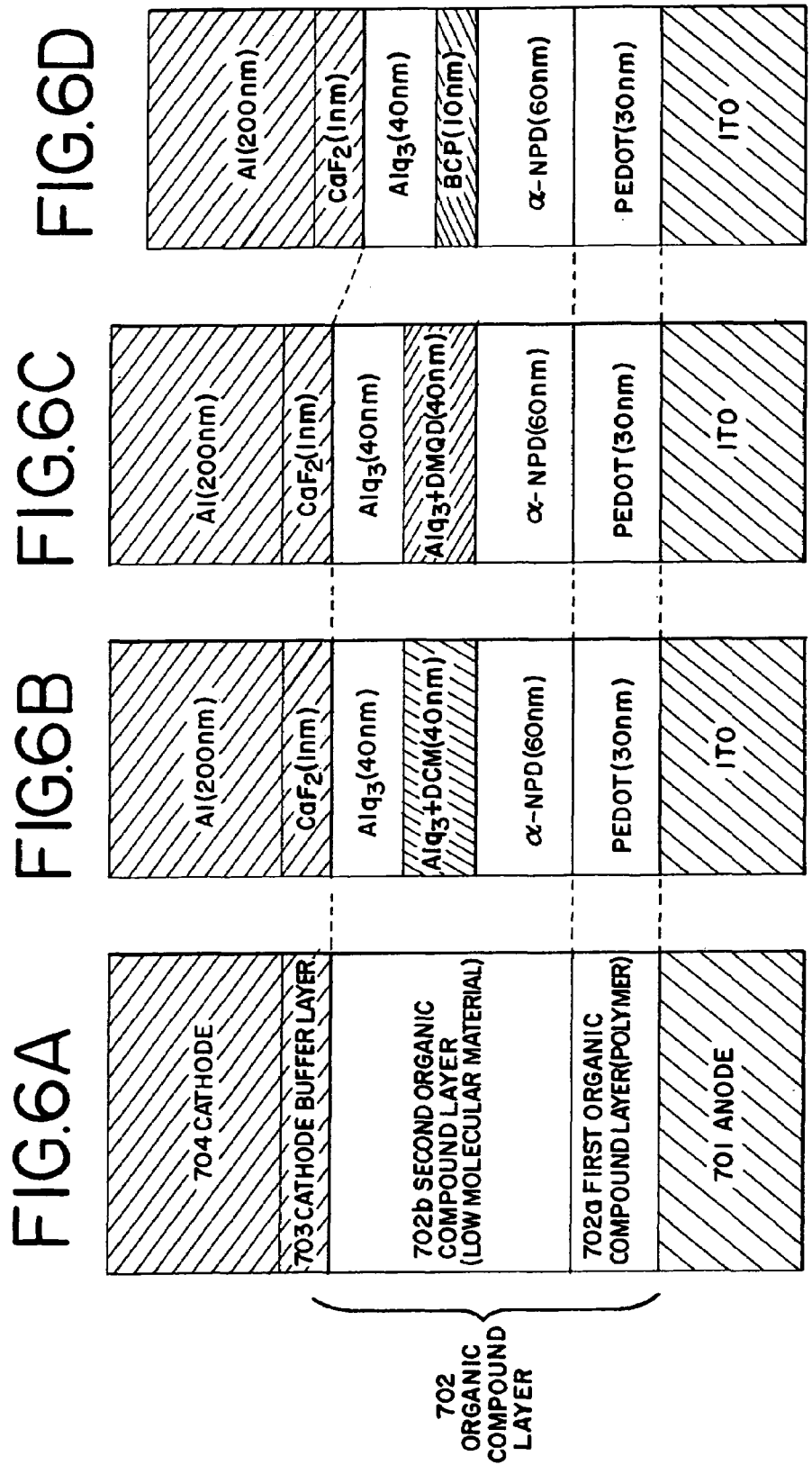

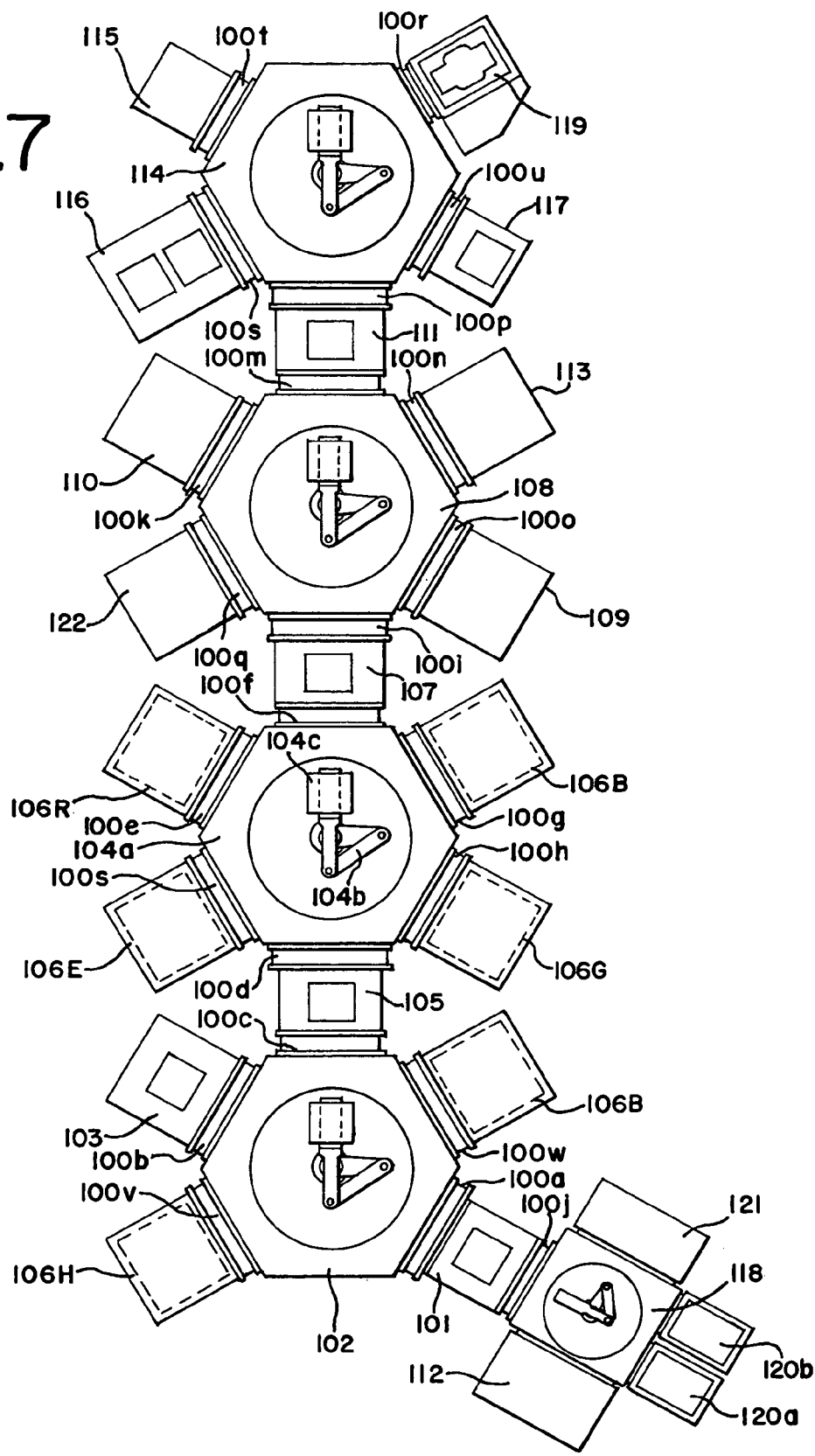

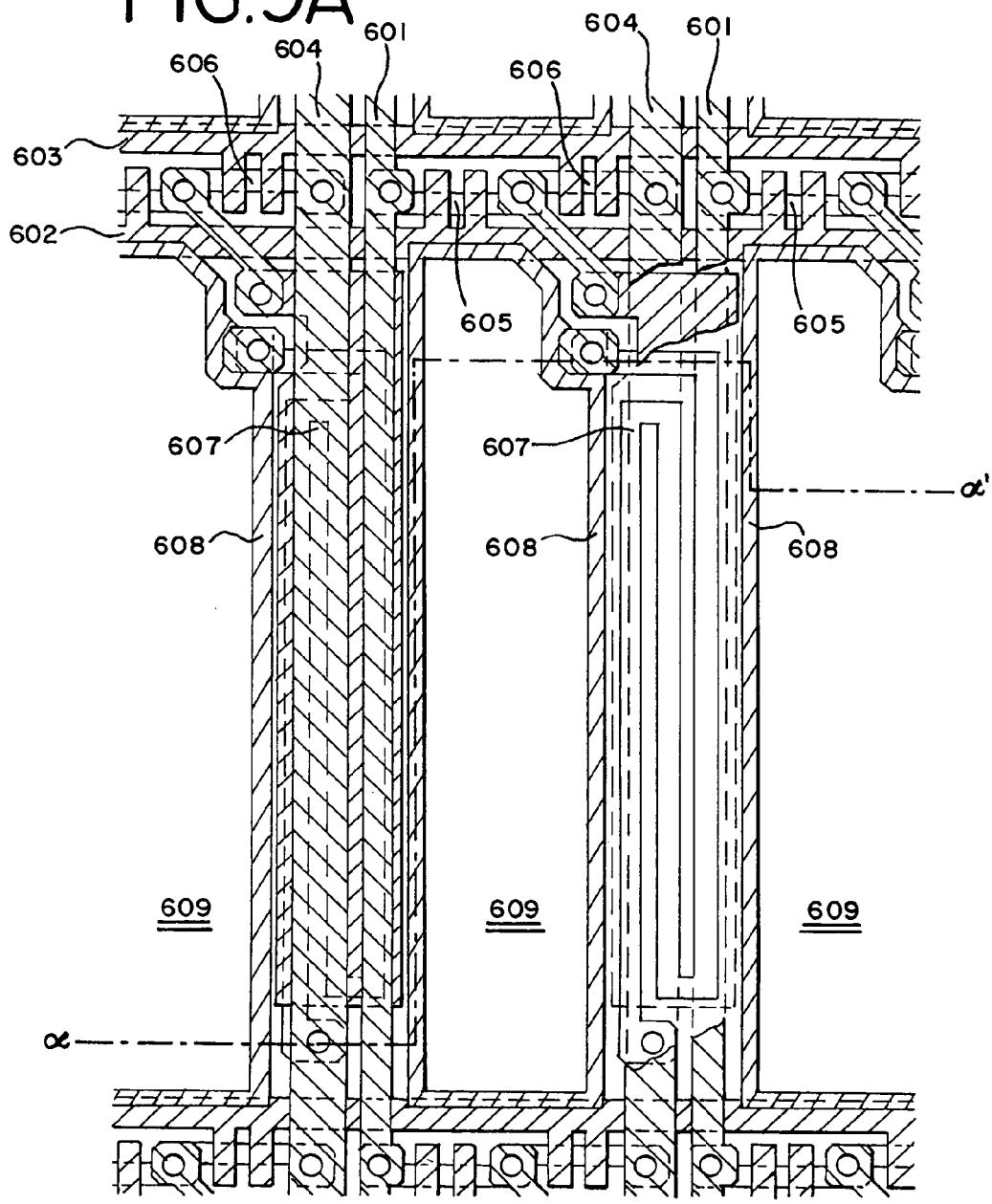
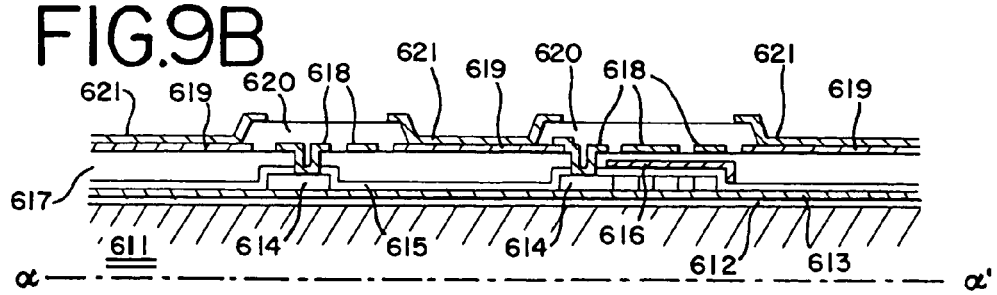

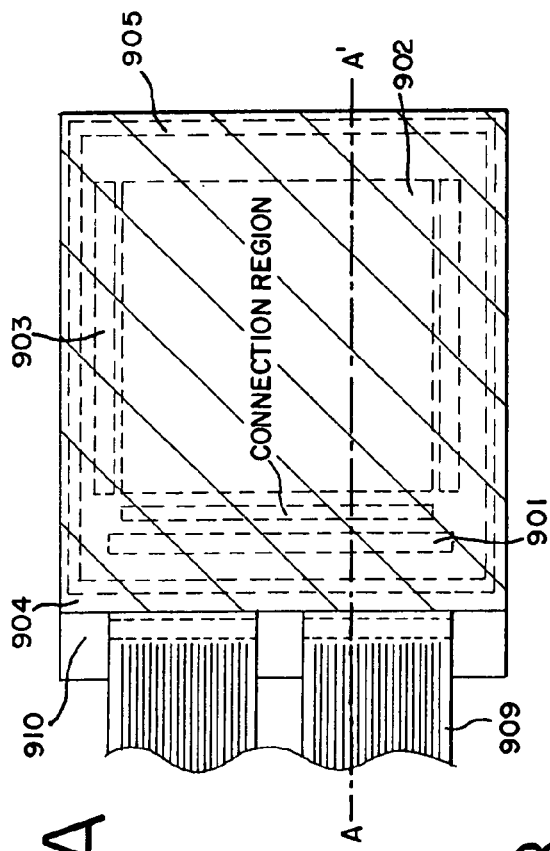
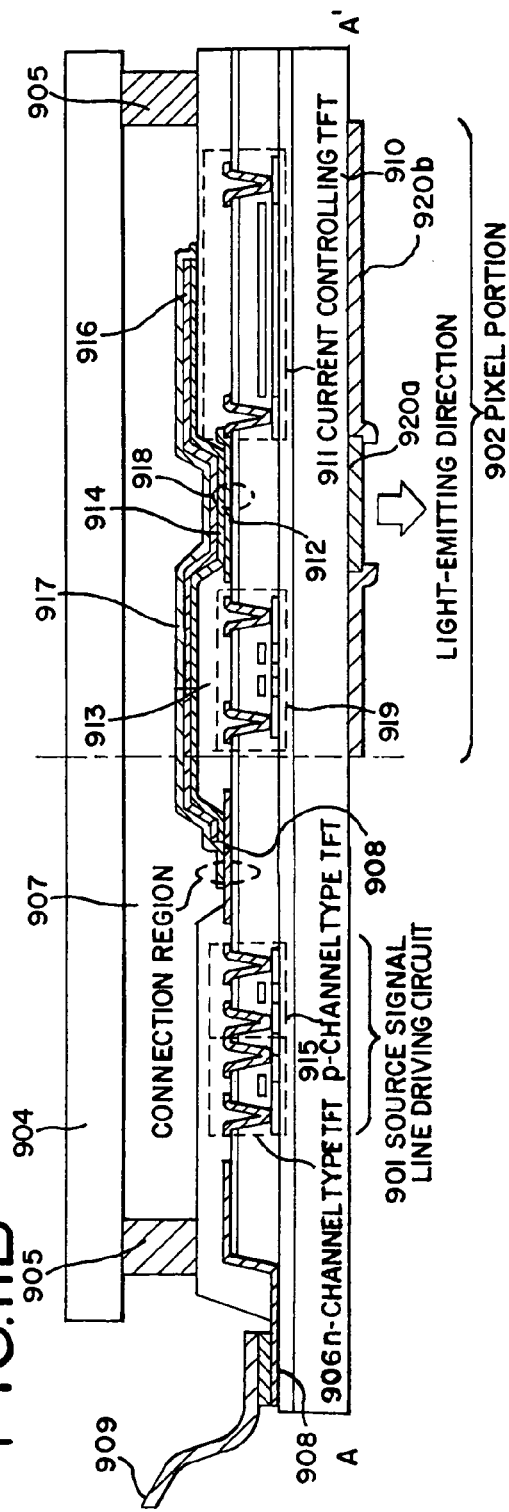
FIG.11A
FIG.11B

LIGHT EMITTING APPARATUS AND METHOD OF FABRICATING THE SAME

BACKGROUND OF THE INVENTION

1. Field of the Invention

The present invention relates to a light emitting apparatus using a luminescent element emitting fluorescence or phosphorescence by applying an electric field to an element having a film including an organic compound (hereinafter, described as "organic compound layer") between a pair of electrodes and a method of fabricating the light emitting apparatus. Further, a light emitting apparatus in the specification includes an image display device, a light emitting device or a light source (including illuminating device). Further, a light emitting apparatus includes all of a module of a light emitting apparatus attached with a connector, for example, FPC (Flexible Printed Circuit) or TAB (Tape Automated Bonding) tape or TCP (Tape Carrier Package), a module provided with a printed circuit board at a front end of TAB tape or TCP and a module in which a luminescent element is directly mounted with IC (Integrated Circuit) by COG (Chip On Glass) system.

2. Description of the Related Art

There is expected application of a luminescent element using an organic compound characterized in thin shape, light weight, high response and direct current voltage drive as a light emitting body to a flat panel display of next generation. Particularly, a display apparatus arranged with luminescent elements in a matrix-like shape seems to be superior to a liquid crystal display apparatus of a related art in view of wide viewing angle and excellence in optical recognizing performance.

According to the light emitting mechanism of a luminescent element, it is said that by interposing an organic compound layer between a pair of electrodes and applying voltage, an electron injected from a cathode and a hole injected from an anode are recombined at a center of light emittance in the organic compound layer to form molecular exciton and when the molecular exciton returns to the ground state, energy is discharged to emit light. There are known singlet excitation and triplet excitation in an excited state and it seems that light can be emitted by way of either of the excited states.

It is possible to use driving methods of passive matrix drive (simple matrix type) and active matrix drive (active matrix type) for such a light emitting apparatus formed by arranging luminescent elements in a matrix-like shape. However, when a pixel density is increased, the active matrix type provided with a switch for each pixel (or dot) is advantageous since the active matrix type can be driven at low voltage.

Further, although a low molecular species material and a high molecular species (polymer species) material are respectively researched for an the organic compound for constituting the organic compound layer (strictly speaking, light emitting layer) regarded to be the core of a luminescent element, more attention is given to the high molecular species material facilitated to handle and having high heat resistance than the low molecular species material.

Further, although there are known methods such as vapor deposition method, spin coating method and ink jet method for a film forming method of the organic compounds, as a method for realizing full color formation by using the high molecular species material, spin coating method and ink jet method are particularly well known.

However, when the spin coating method is used, the organic compound is formed over an entire film forming surface and therefore, it is difficult to selectively form the film in which the organic compound is formed only at a portion intended to form the film and the film is not formed at a portion which is not necessary to form the film.

Further, the active matrix type light emitting apparatus is formed with a wiring for inputting an electric signal from an outside power source to a drive circuit formed over a substrate, and a wiring for electrically connecting a luminescent element comprising a cathode, an anode and the organic compound layer formed by the organic compound formed at a pixel portion and the outside power source and therefore, when the organic compound is formed at the portions of the wirings connected to the outside power source, there poses a problem that ohmic contact cannot be achieved with outside power source.

Meanwhile, according to the ink jet method known as a method of selectively forming an organic compound of a high molecular species, although organic compounds for emitting three kinds (R, G, B) of light can be coated to divide in one step, film forming accuracy is poor, the control is difficult and therefore, uniformity is not achieved and dispersion is liable to be brought about. As causes of the dispersion in the ink jet method, a dispersion in nozzle pitch, a dispersion in bending in ink flying, a dispersion in stage matching accuracy and a dispersion in timings of delivery of ink and movement of stage. For example, there are problems in conditions of execution in which a nozzle for ink jet is clogged by internal viscous resistance of ink prepared by dissolving the organic compound in a solvent and ink injected from the nozzle is not impacted to a desired position and a problem in practical use in which the need for an exclusive apparatus having a highly accurate stage, an automatic alignment mechanism and an ink head becomes costly. Further, ink spreads after impact and therefore, a margin to some degree is needed as an interval between contiguous pixels to thereby make highly fine formation difficult.

SUMMARY OF THE INVENTION

Hence, it is an object of the invention to provide a method of selectively forming a high molecular species material layer which is simpler than using an ink jet method in a light emitting apparatus of an active matrix type using a high molecular species organic compound. Further, it is an object thereof to simply form a structure in which the organic compound layer is not formed at a connection portion of a wiring connected to an outside power source by enabling to selectively form the high molecular species material layer.

Further, according to a light emitting apparatus, there poses a problem that outside scenery is imaged on an observing face (face directed to a side of an observer) by reflecting incident outside light (light outside of the light emitting apparatus) by a rear face of a cathode (face on a side in contact with a luminescent layer) at a pixel which does not emit light. Further, in order to avoid the problem, it is devised that a circularly polarized light film is pasted on an observing face of the light emitting apparatus to thereby prevent outside scenery from being imaged on the observing face, however, the circularly polarized light film is very expensive and therefore, there poses a problem of an increase in the fabrication cost.

According to the invention, a film comprising a high molecular species material is formed over an entire face of a lower electrode connected to a thin film transistor by a coating method and thereafter, a film comprising a polymer (high molecular material) is etched by etching by plasma to thereby enable to selectively form the high molecular species material layer.

According to constitution 1 of the invention related to a fabricating method disclosed in the specification, there is provided a method of fabricating a light emitting apparatus, the method comprising:

a forming a film comprising an organic compound over (above)a first electrode by a coating method;

selectively etching the film comprising the organic compound by etching plasma; and selectively forming a second electrode over the film comprising the organic compound.

Further, the etching by plasma may be carried out after selectively forming the second electrode after forming the organic compound film by spin coating.

According to constitution 2 of the invention related to a fabricating method disclosed in the specification, there is provided a method of fabricating, the method comprising:

forming a film comprising a organic compound over a first electrode by a coating method;

selectively forming a second electrode over said film comprising said organic compound; and selectively etching said film comprising said organic compound by plasma etching.

Further, a third electrode for constituting an auxiliary electrode may be formed for forming an upper electrode by low resistance and according to constitution 3 of the invention related to a fabricating method disclosed in the specification, the method comprising:

forming a thin film transistor over a first substrate;

forming a first electrode connected to the thin film transistor;

forming an insulating substance covering an end portion of the first electrode;

forming a third electrode comprising a metal material over the insulating substance;

forming a film comprising an organic compound over the first electrode by a coating method;

exposing the third electrode by selectively etching said film comprising said organic compound using a mask by plasma etching;

selectively forming a second electrode comprising a material having a light transmitting performance on said film comprising said organic compound;

forming a protective film; and pasting together the first substrate and the second substrate.

Further, in the above-described constitution 3, the protective film is characterized to be an insulating film whose major component is silicon oxide, an insulating film whose major component is silicon nitride, a film whose major component is carbon or a laminated film of these. Further, in the above-described constitution 3, an interval between the first substrate and the second substrate is characterized to be a range of 2 μm through 30 μm.

Further, in the above-described respective constitutions, in vacuum heating said film comprising said organic compound, said film comprising said polymer, formed over the first electrode by a coating method after forming said layer comprising said organic compound, said comprising a polymer, over the first electrode.

Further, in the above-described respective constitutions, the first electrode is characterized to be an anode or a cathode of the luminescent element electrically connected to a TFT.

Further, in the above-described respective constitutions, the plasma is generated by exciting a single kind or a plurality of kinds of gases selected from the group constituting of Ar, H, F and O.

Further, in the above-described respective constitutions, the organic compound layer is characterized to be a material for emitting light of white color and combined with a color filter provided at the second substrate, or the organic compound layer is characterized to be a material for emitting light of a single color and combined with a color changing layer or a coloring layer provided at the second substrate.

Further, the invention devises a shape of an insulating substance (referred to as bank, partition wall, barrier, embarkment or the like) provided between respective pixels to eliminate a failure in coverage in forming a high molecular organic compound film by a coating method.

Further, according to constitution 4 of the invention disclosed in the specification, there is provided a light emitting apparatus comprising a drive circuit, a terminal portion and a pixel portion, said pixel portion having a plurality of luminescent elements between a first substrate having an insulating surface and a second substrate having a light transmitting performance;

wherein each of said plurality of luminescent elements comprises a first electrode, a layer comprising an organic compound in contact with an upper face of the first electrode, and a second electrode in contact with an upper face of the layer comprising the organic compound: and wherein an end portion of the first electrode is covered by an insulating substance, a side face of the insulating substance includes a curved face having a first radius of curvature and a curved face having a second radius of curvature and the layer comprising the organic compound, said layer comprising a polymer, is provided over the insulating substance and the first electrode.

Further, as constitution 5 of the invention, when a third electrode for constituting an auxiliary electrode for forming an upper electrode by low resistance is formed, there is provided a light emitting apparatus which is a light emitting apparatus comprising a drive circuit, a terminal portion and a pixel portion, said pixel portion having a plurality of luminescent elements between a first substrate having an insulating surface and a second substrate having a light transmitting performance;

wherein each of said plurality of luminescent elements comprises a first electrode, a layer comprising an organic compound over the first electrode, and a second electrode over the layer comprising the organic compound: and wherein an end portion of the first electrode is covered by an insulating substance, a side face of the insulating substance includes a curved face having a first radius of curvature and a curved face having a second radius of curvature, a third electrode is provided over the insulating substance and the layer comprising the organic compound, the layer comprising a polymer, is provided over the insulating substance and the first electrode.

Further, in the above-described constitutions 4, 5, the organic compound layer is a laminated layer of a layer comprising a polymer and a layer comprising a low molecular material.

Further, in the above-described constitutions 4, 5, the layer comprising the organic compound comprises a material which is characterized to be luminescent in white color and combined with a color filter provided at the second substrate, or the layer comprising the organic compound is characterized to comprise a material of emitting light of a single color and combined with a color changing layer or a coloring layer provided at the second substrate.

Further, in the above-described constitutions 4, 5, an upper end portion of the insulating substance is characterized to the curved face having the first radius of curvature, a lower end portion of the insulating substance includes the curved face having the second radius of curvature and the first radius of curvature and the second radius of curvature is a range of 0.2 μm through 3 μm. Further, a taper angle of the insulating substance may be a range of 35° through 55°.

Further, in the above-described constitutions 4, 5, the second substrate characterized to include a recessed portion provided with a drying agent and the recessed portion overlaps a part of an entire drive circuit provided over the first substrate.

Further, in the above-described constitutions 4, 5, an interval between the first substrate and the second substrate is characterized to be a range of 2 μm through 30 μm.

Further, in the above-described constitutions 4, 5, wherein said layer comprising said organic compound comprises poly (ethylenedioxythiophene)/poly(stylenesulfonic acid).

Further, an EL element includes a layer including an organic compound achieving luminescence (Electro Luminescence) generated by applying an electric field, an anode, and a cathode. The luminescence in the organic compound includes luminescence (fluorescence) in returning from a singlet excited state to the ground state and luminescence (fluorescence) in returning from a triplet excited state to the ground state. And a light emitting apparatus fabricated by a fabricating apparatus and a film forming method of the invention is applicable to both cases of using luminescence.

A luminescent element (EL element) having an EL layer is constituted by a structure in which the EL layer is interposed between a pair of electrodes and the EL layer is normally constructed by a laminated structure. Representatively, there is pointed out a laminated structure of "hole transporting layer/luminescent layer/electron transporting layer" proposed by Tang et al. of Kodak Eastman Company. The structure is provided with a very high luminescence efficiency and currently, almost all the light emitting apparatus on which research and development is progressed adopt the structure.

Further, otherwise, there may be constructed a structure of laminating a hole injecting layer, a hole transporting layer, a luminescent layer, an electron transporting layer or a hole injecting layer, a hole transporting layer, a luminescent layer, an electron transporting layer, an electron injecting layer, in this order on an anode. The luminescent layer may be doped with a fluorescent pigment or the like. Further, all of the layers may be formed by using a low molecular species material or using a high molecular species material. Further, in the specification, all the layers provided between a cathode and an anode are generally referred to as EL layers. Therefore, all of the hole injecting layer, the hole transporting layer, the luminescence layer, the electron transporting layer and the electron injecting layer are included in the EL layers.

Further, according to an active matrix type light emitting apparatus, there are conceivable two ways of structures by a direction of emitting light. One is a structure in which light emitted from an EL element transmits through an opposed substrate to emit to enter eyes of the observer. In this case, the observer can recognize an image from a side of the opposed substrate. Other is a structure in which light emitted from an EL element transmits through an element substrate to emit to enter eyes of the observer. In this case, the observer can recognize the image from the side of the element substrate. The invention is applicable to both of two ways of structures.

Further, in the light emitting apparatus of the invention, a method of driving to display a screen is not particularly limited, for example, a dot successive driving method, a line successive driving method or a face successive driving method may be used. Representatively, as the line successive driving method, a time division gray scale driving method or an area gray scale driving method may pertinently be used. Further, an image signal inputted to a source line of the light emitting apparatus may be an analog signal, may be a digital signal and a drive circuit or the like may pertinently be designed in accordance with an image signal.

BRIEF DESCRIPTION OF THE DRAWINGS

FIGS. 1A and 1B are views showing sectional views (Embodiment 1);

FIGS. 4A, 4B and 4C are views showing element structures (Embodiment 4);

FIGS. 5A, 5B and 5C are schematic views when full color formation is achieved by using emittance of white color (Embodiment 4);

FIGS. 6A, 6B, 6C and 6D are schematic views when full color formation is achieved by laminating a high molecular material and a low molecular material (Embodiment 5);

FIG. 7 is a view showing a fabricating apparatus (Example 1);

FIGS. 9A and 9B are views showing a top view and a sectional view of a pixel (Example 1);

FIGS. 11A and 11B are a top view and a sectional view of an active type display apparatus (Embodiment 2);

DETAILED DESCRIPTION OF PREFERRED EMBODIMENTS

Embodiments of the invention will be explained as follows.
(Embodiment 1)

FIG. 1A shows a sectional view of an active matrix type light emitting apparatus. Here, a luminescent element 13 having a laminated structure comprising a high molecular material for emitting light of white color will be explained as an example.

Figure 8:
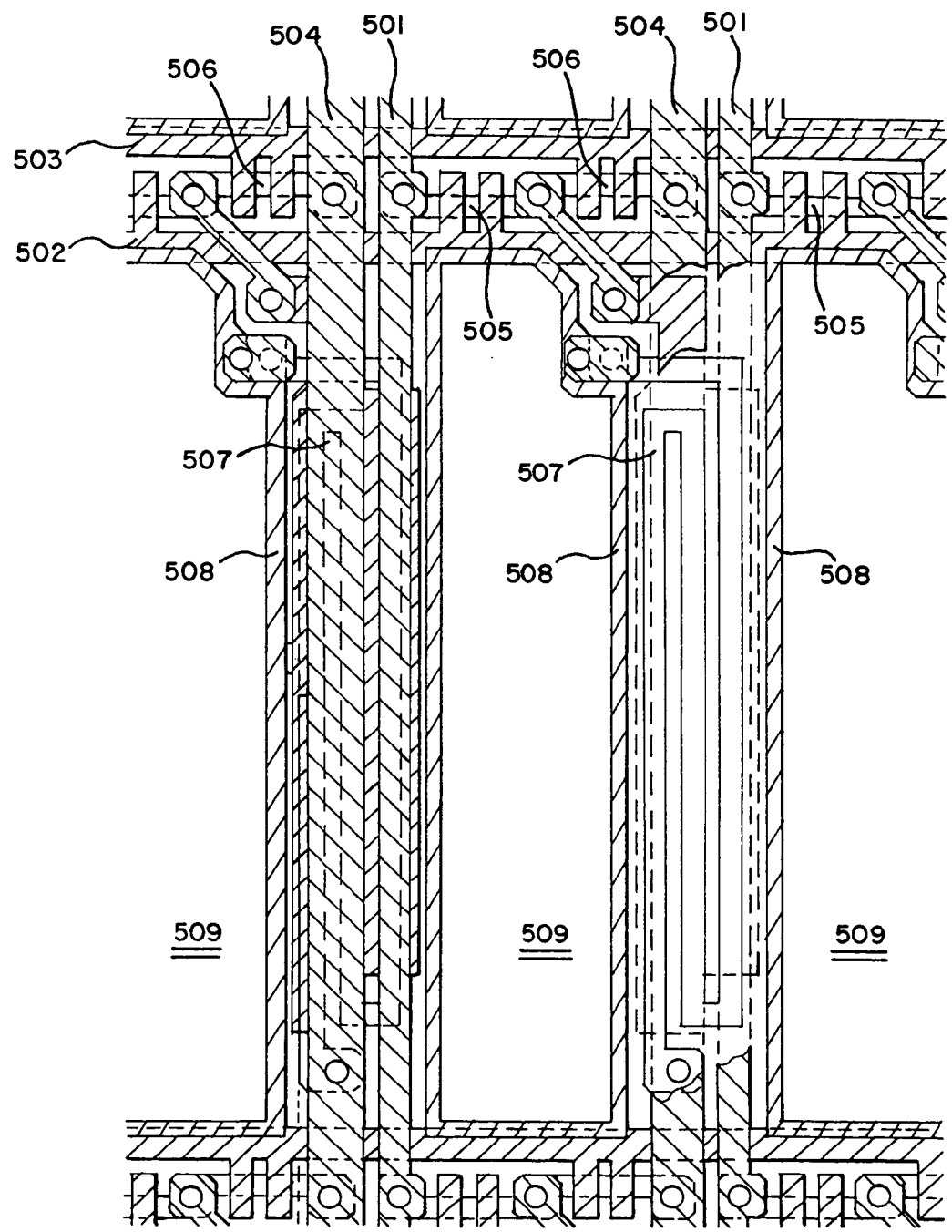
FIG. 8 is a view showing a top view of a pixel (Embodiment 1)

In FIG. 1A, a plurality of TFTs 1 through 3 are provided over a substrate having an insulating surface. Further, TFT 1 and TFT 2 are elements constituting portions of a drive circuit portion. Further, TFT3 provided at a pixel portion is an element for controlling current flowing in EL layers 11a and 11b for emitting light of white color and numeral 4 designates a source electrode or a drain electrode. Here, TFT 3 constitutes TFT having a plurality of channels. Further, a channel length L of TFT 3 is preferably equal to or larger than 100 μm. When the channel length L is prolonged, oxide film capacitance $C_{OX}$ is increased and therefore, a portion of the capacitance can be utilized as hold capacitance of an organic luminescent element. According to a related art, hold capacitance is formed for each pixel and therefore, a space for forming the hold capacitance is needed and a capacitance line or a capacitance electrode is provided, however, the capacitance line or the capacitance electrode can be omitted by constituting the pixel of the invention. Further, when the hold capacitance is formed by the oxide capacitance $C_{ox}$, the hold capacitance is formed by a gate electrode and a semiconductor (channel forming region) overlapping the gate electrode by constituting a dielectric body by the gate insulating film. Therefore, even when the channel length of TFT is prolonged, in a case in which as shown by FIG. 8, a semiconductor layer of driving TFT 507 connected to a pixel electrode 508 is arranged below a current supply line 504 and a source signal line 501 arranged at an upper layer of a gate electrode, the pixel can be designed without reducing numerical aperture. That is, by constituting the pixel as shown by FIG. 8, even when a space for forming a capacitance electrode and a capacitance wiring is omitted, sufficient hold capacitance can be provided and the numerical aperture can be increased. Further, in case of prolonging the channel length L, even when a dispersion in a TFT fabricating process such as a condition of irradiating a laser beam is brought about, a dispersion in an electric property among respective TFTs can be reduced. Further, numeral 5 designates an interlayer insulating film comprising an organic insulating material and numeral 6 designates an interlayer insulating material comprising an inorganic insulating film material.

Further, numeral 7 designates a first electrode, that is, an anode (or cathode) of an organic luminescent element and numeral 12 designates a second electrode, that is, a cathode (or anode) of the organic luminescent element. Here, as designated by numeral 20, the cathode is constituted by a laminated film of a thin metal layer (representatively, alloy of MgAg, MgIn, AlLi) and a transparent conductive film (ITO (indium oxide tin oxide alloy), indium oxide zinc oxide alloy ($In_2O_3$—ZnO), zinc oxide (ZnO)) for transmitting light from each luminescent element. Further, the thin metal film functions as the cathode and the transparent conductive film functions as a wiring for reducing electric resistance of the cathode.

Further, both end portions of the first electrode 7 and an interval therebetween are covered by an organic insulating substance 8 (also referred to as barrier or bank). Further, the organic insulating substance 8 may be covered by an inorganic insulating film.

Figure 16:
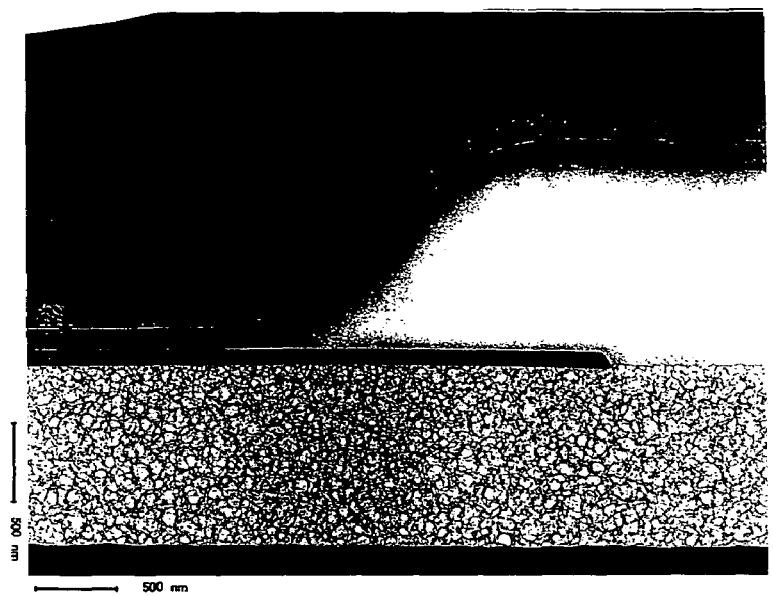
FIG. 16 is a photographic view showing a section (Embodiment 1)
Figure 17:
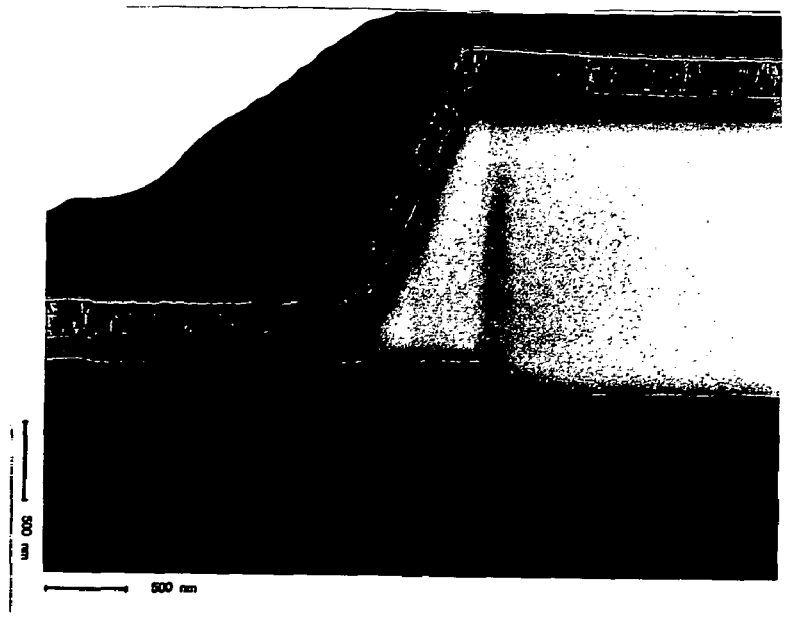
FIG. 17 is a photographic view showing a section (Comparative Example).

According to the invention, a sectional shape of the organic insulating substance 8 becomes important. FIG. 1B shows an enlarged view of a periphery of the organic insulating substance 8. In a case of forming an organic compound film on the organic insulating substance 8 by a coating method or in a case of forming a metal film for constituting a cathode by vapor deposition method, when a curved face is not provided at a lower end or an upper end of the organic insulating substance, as shown by FIG. 17, a failure in film forming of forming a projected portion is brought about at the upper end portion of the organic substance. Hence, the invention is characterized in constituting a shape having a curved face having a first radius of curvature at the upper end portion of the organic insulating substance 8 and having a curved face having a second radius of curvature at the lower end portion of the organic insulating substance 8 as shown by FIG. 16. Further, both of the first radius of curvature and the second radius of curvature are preferably 0.2 μm through 3 μm. By the invention, coverage of the organic compound film or the metal film can be improved. Further, the taper angle at a side face of the organic insulating substance 8 may be 45°±10°.

Further, according to the invention, a third electrode 9 (auxiliary electrode) is provided over the organic insulating substance 8. There is posed a problem that film resistance of the transparent electrode is increased in an active matrix type light emitting apparatus having a luminescent element of a structure shown by FIGS. 1A and 1B, that is, a structure in which an electrode on a side of TFT electrically connected to TFT over the substrate is formed as a cathode, the organic compound layer is formed over the cathode and an anode constituting the transparent electrode is formed over the organic compound layer (hereinafter, referred to as upper face emitting structure). Particularly, when the film thickness of the transparent electrode is thinned the film resistance is further increased. When the film resistance of the transparent electrode for constituting the anode or the cathode is increased, a drawback that an in-face potential distribution becomes nonuniform by voltage drop and a dispersion is produced in brightness of the luminescent element is brought about. Hence, according to the invention, the third electrode 9 (auxiliary electrode) is provided for reducing the film resistance of the transparent electrode at the luminescent element. Further, also in the third electrode 9, it is preferable to constitute a taper angle of a side face of the third electrode by 45°±10° in order to improve coverage of the organic compound film or the metal film.

Further, the third electrode 9 is characterized in comprising a material having electric resistance smaller than that of the material constituting the second electrode 12 and comprising a film whose major component is an element selected from the group constituting of poly-Si doped with an impurity element for providing a conductive type, W, $WSi_x$, Al, Ti, Mo, Cu, Ta, Cr and Mo or an alloy material or a compound material whose major component is constituted by the element or a laminated film of these. For example, the third electrode is preferably constituted by an electrode by a laminated layer constituting a topmost layer by a nitride layer or a fluoride layer (specifically, a laminated layer of TiN and Al and TiN).

Simultaneously with forming the third electrode 9, an extension wiring may be formed and connected to other wiring 10 present at a lower layer. In this way, when the transparent conductive film 12 is formed in contact over the auxiliary electrode 9 in contact with the electrode at the lower layer, the cathode can easily be extended.

Both of the organic compound layers 11a and 11b formed by the coating method are patterned by etching using plasma and therefore, end faces thereof coincide with each other.

Further, in FIG. 1A, a protective film 14 is formed in order to promote reliability of the light emitting apparatus. The protective film 14 is an insulating film whose major component is silicon nitride or silicon oxynitride or a thin film whose major component is carbon provided by the sputtering method (DC system or RF system). When the protective film 14 is formed in an atmosphere including nitrogen and argon by using a silicon target, a silicon nitride film is provided. Further, a silicon nitride target may be used. Further, the protective film 14 may be formed by a film forming apparatus using remote plasma. Further, in FIG. 1A, it is preferable to make the film thickness of the protective film as thin as possible in order to pass emitted light through the protective film.

The invention is characterized in that the thin film whose major component is carbon is constituted by a DLC (Diamond like Carbon) film having a film thickness of 3 through 50 nm. Although the DLC film is provided with $SP^3$ bond as a bond among carbon atoms in a short distance order, macroscopically, the DLC film is constituted by an amorphous-like structure. The composition of the DLC film is constituted by 70 through 95 atomic % of carbon and 5 through 30 atomic % of hydrogen and the DLC film is very hard and excellent in insulating performance. The DLC film is characterized in that permeability of gas of steam, oxygen or the like is low. Further, it is known that the DLC film is provided with a 15 through 25 GPa hardness by measurement by a very small hardness meter.

The DLC film can be formed by a plasma CVD method (representatively, RF plasma CVD method, microwave CVD method, electron cyclotron resonance (ECR) CVD method), or sputtering method. By using any of the film forming methods, the DLC film can be formed with excellent adherence. The DLC film is formed by installing a substrate at a cathode. Further, a dense and hard film can be formed by applying negative bias and utilizing ion bombardment to some degree.

As a reaction gas used in film forming, hydrogen gas and a hydrocarbon species gas (for example, $CH_4$, $C_2H_2$, $C_6H_6$ or the like) is used, the gas is ionized by glow discharge and the film is formed by accelerating and impacting ions to a cathode applied with negative self bias. Thereby, the dense and smooth DLC film can be provided. Further, the DLC film is an insulating film which is transparent or semitransparent for visible light. In the specification, being transparent for visible light indicates that transmittance of visible light is 80 through 100% and being semitransparent for visible light indicates that transmittance of visible light is 50 through 80%.

Further, when a silicon nitride film is formed in contact with a film comprising a transparent conductive film by a sputtering method, although there is a concern of mixing an impurity (In, Sn, Zn etc.) included in the transparent conductive film into the silicon nitride film, by forming a silicon oxide film constituting a buffer layer therebetween, the impurity can be prevented from mixing to the silicon nitride film. By forming the buffer layer by the above-described constitution, mixing of the impurity (In, Sn, etc.) from the transparent conductive film can be prevented and the excellent protective film without impurity can be formed.

Further, in FIG. 1A, the constitution is hermetically closed by a substrate 18 for sealing the luminescent element 13 and a seal member 19a including a spacer 19b. Further, since the luminescent element 13 emits light of white color, the substrate is provided with a color filter in correspondence with each pixel. Numeral 15 designates any of a coloring layer of red color, a coloring layer of green color and a coloring layer of blue color and numeral 16 designates a black color portion of the color filter, that is, a light blocking portion (BM) for blocking light to a region other than a light emitting region. Further, the light blocking portion 16 is constituted by a metal film (chromium or the like) or an organic film including a black pigment. Further, an overcoat film 17 for covering the coloring layer 15 and the light blocking portion 16 is provided.

Further, in FIG. 1A, a terminal portion for pasting FPC for connecting to an outside circuit is provided. Further, at the terminal portion, an electrode of a terminal is formed by a material the same as that of the cathode 10.

Further, in order to increase color purity, a seal substrate 30 is provided with a color filter in correspondence with each pixel. In the color filter, a coloring layer 31b of red color is provided to be opposed to a light emitting region (R) of red color, a coloring layer 31c of green color is provided to be opposed to a light emitting region (G) of green color and a coloring layer 31d of blue color is provided to be opposed to a light emitting region (B) of blue color. Further, the region other than the light emitting region is blocked from light by the black color portion of the color filter, that is, a light blocking portion 31a. Further, the light blocking portion 31a is constituted by a metal film (chromium or the like) or an organic film including a black pigment.

Further, according to the invention, by providing the color filter, a polarizer for circulatory polarizer light is dispensed with, the cost is reduced and coating to divide is not needed and therefore, an increase in the throughput and highly fine formation can be realized.

Further, although an explanation has been given here of the top gate type TFT as an example, the invention is applicable regardless of the TFT structure, for example, applicable to a bottom gate type (inverse stagger type) TFT or forward stagger type TFT.

(Embodiment 2)

Figure 2A:
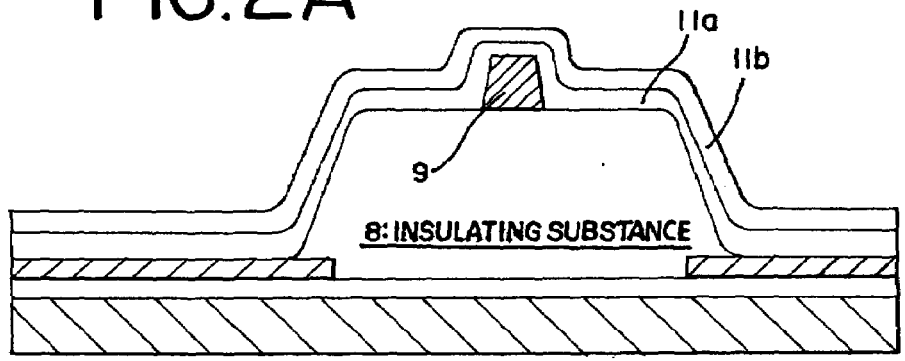
FIGS. 2A, 2B and 2C are views showing an etching step (Embodiment 2)
Figure 2B:
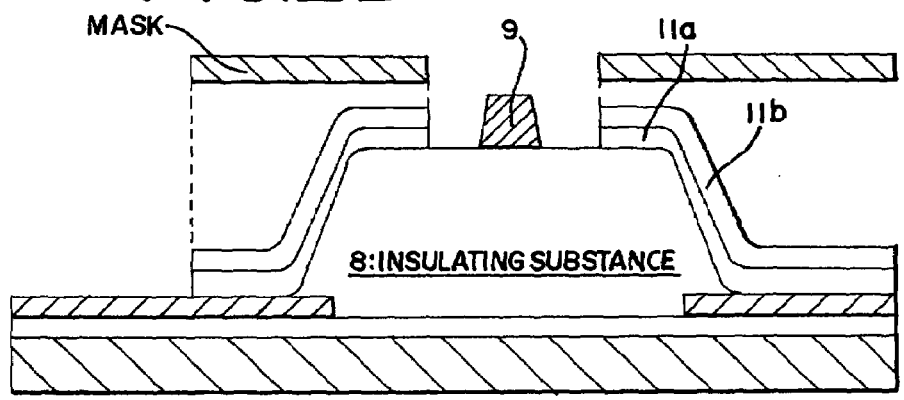

Here, a simplified explanation will be given as follows of a procedure of forming a luminescent element shown in FIG. 1B in reference to FIGS. 2A, 2B and 2C. Further, for simplification, portions in FIGS. 2A, 2B and 2C the same as those of FIG. 1 designate the same.

First, TFT (not illustrated here), the first electrode 7, the connection wiring 10, the insulating substance 8 and the third electrode 9 are formed over the substrate, thereafter the organic compound layer 11a is formed by a coating method using spin coating, thereafter sintered by heating in vacuum and successively, the organic compound layer 11b is sintered by heating in vacuum to laminate. (FIG. 2A)

Successively, etching is carried out selectively by using plasma generated by exciting a single kind or a plurality of kinds of gases selected from the group consisting of Ar, H, F and O. In the etching, the desired region is removed by using a metal mask (FIG. 2B). Although in FIG. 2B, an example in which an interval between the metal mask and the organic compound layer is spaced apart from each other is shown, the etching may be carried out in a state of bringing the metal mask and the organic compound layer in contact with each other. By enabling to selectively form the high molecular species material layer by the invention, a structure in which the organic compound layer is not formed at a connection portion of a wiring connected to an outside power source is simply formed. Further, by exposing a desired portion of the third electrode 9, the portion is made to electrically connect to the transparent conductive film formed later.

Figure 2C:
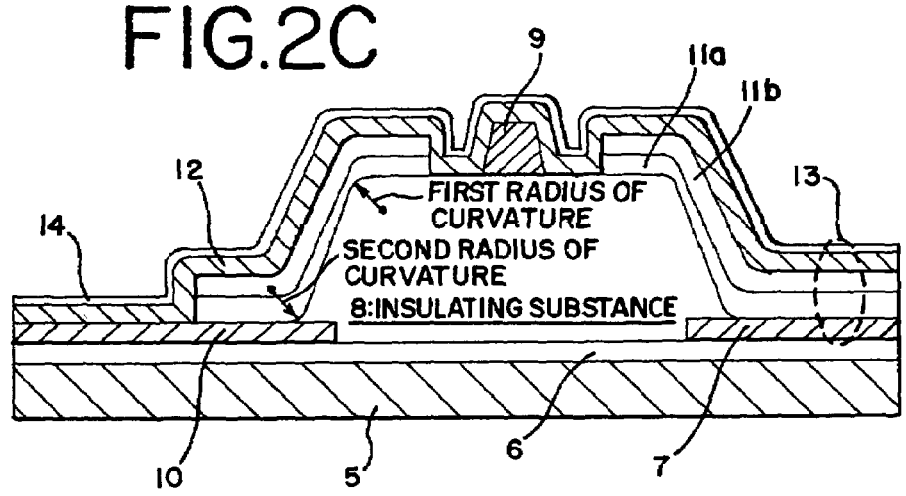

Successively, there is formed the cathode (second electrode 12) comprising a thin metal layer (representatively, alloy of MgAg, MgIn, AlLi or the like) and the transparent conductive film (ITO (indium oxide tin oxide alloy), indium oxide and zinc oxide alloy ($In_2O_3$—ZnO), zinc oxide (ZnO) or the like) (FIG. 2C). In addition, though only a thin metal layer serves actually as a cathode, the transparent conductive film is also referred to as a cathode as a matter of convenience in this specification.

Further, although according to the embodiment, an example of forming the organic compound layer and thereafter carrying out plasma etching is shown, plasma etching may be carried out after forming the laminated film of the thin metal layer and the transparent conductive film on the organic compound layer to thereby remove the desired region and the transparent conductive film may be formed again. Besides, as another example, the thin metal layer is formed on the organic compound layer, then, a desired region is removed by plasma etching, and then, the transparent conductive film is laminated thereon.

Further, the embodiment can be combined with Embodiment 1.

(Embodiment 3)

Figure 3A:
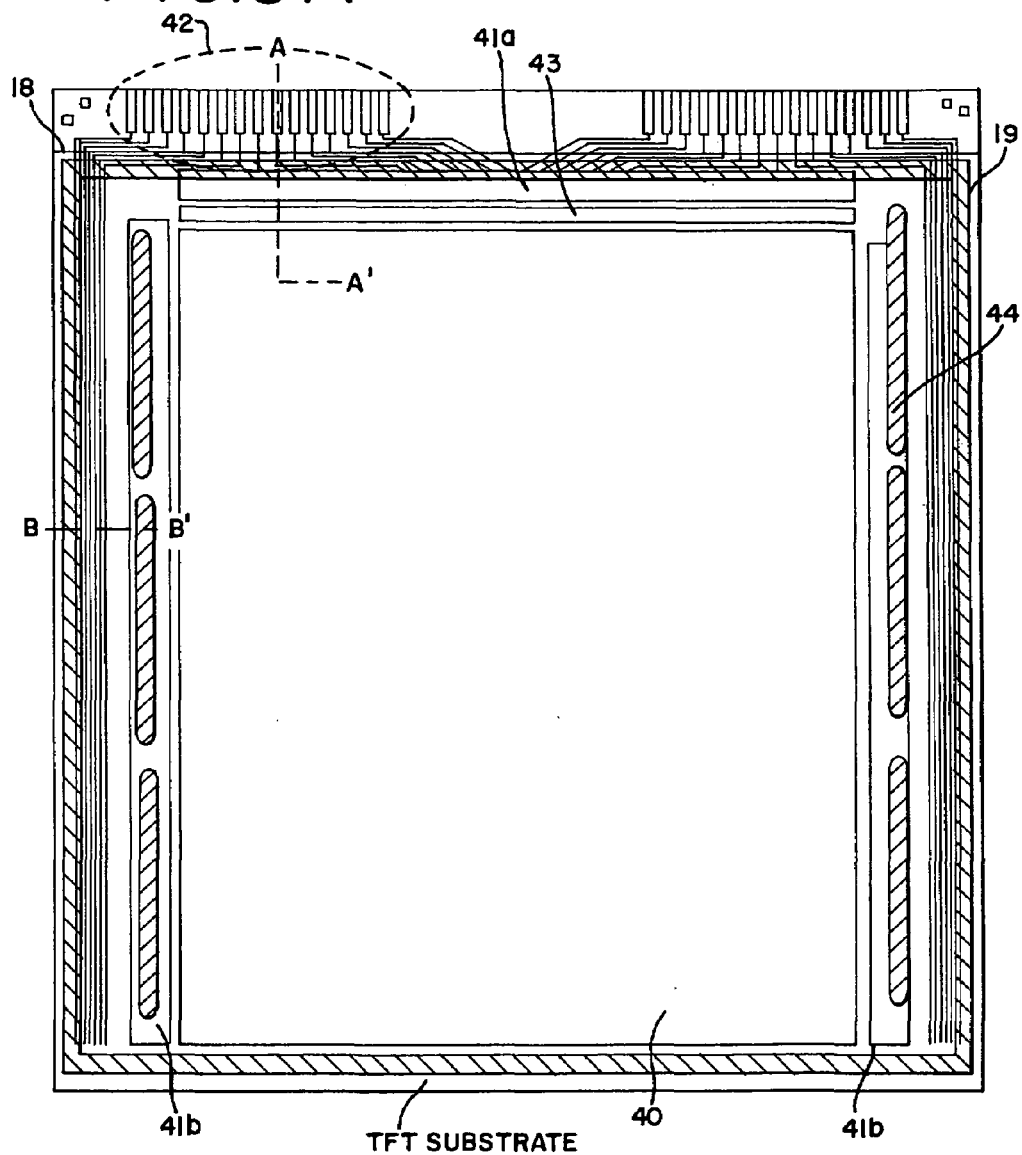
FIGS. 3A, 3B and 3C are a top view and sectional views showing an arrangement of a drying agent (Embodiment 3)

Here, a total of an EL module and arrangement of a drying agent will be explained in reference to FIGS. 3A, 3B and 3C. FIG. 3A is a top view of the EL module. Further, FIG. 3A corresponds to FIG. 1, a sectional view cut by a dotted line A-A' corresponds to FIGS. 1A and 1B and the same notations are used for the same portions.

A substrate provided with numerous TFTs (also referred to as TFT substrate) is provided with a pixel portion 40 for display, drive circuits 41*a* and 41*b* for driving respective pixels of the pixel portion, a connecting portion for connecting the electrode provided over the EL layer and an extended wiring, a terminal portion 42 for pasting FPC for connecting to outside circuit and a drying agent 44. Further, the drying agent 44*c* may be arranged such that a total of the drive circuits 41*c* is concealed by the drying agent 44*c* as shown by FIG. 3C although the drying agent is arranged to overlap a portion thereof in FIG. 3A and FIG. 3B. Further, the constitution is hermetically sealed by the substrate for sealing the EL element and a seal member 19. Further, FIG. 3B is a sectional view when the constitution is cut by a chain line B–B' in FIG. 3A.

Pixels are numerously arranged regularly at the pixel portion 40 and arranged in an order of R, G, B in X direction although not illustrated here.

Figure 3B:
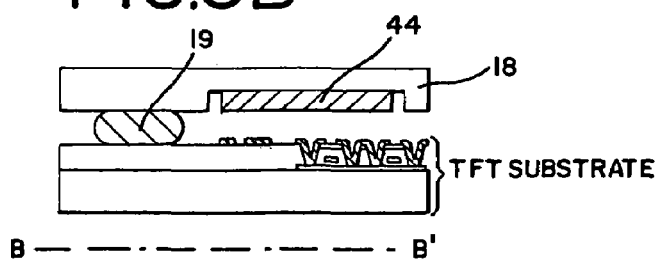
Figure 3C:
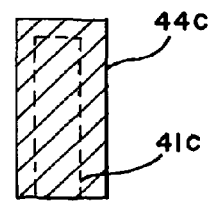

Further, as shown by FIG. 3B, the seal substrate 18 is pasted by the seal member 19 to maintain an interval of about 2 through 30 μm and all of the luminescent elements are hermetically sealed. A recessed portion is formed at the seal substrate 18 by sand blast method or the like and the recessed portion is arranged with the drying agent. Further, the seal member 19 is preferably constituted by a narrow frame formation to overlap a portion of the drive circuits. Degassing is preferably carried out by carrying out annealing in vacuum immediately before pasting the seal substrate 18 by the seal member 33. Further, when the seal substrate 18 is pasted, the pasting is preferably be carried out under an atmosphere including an inert gas (rare gas or nitrogen).

Further, the embodiment can freely be combined with Embodiment 1 or Embodiment 2.

(Embodiment 4)

A method of combining a white color luminescent element and a color filter (hereinafter, referred to as color filter method) will be explained in reference to FIG. 5A as follows.

The color filter method is a system of forming a luminescent element having an organic compound film displaying white color luminescence and passing the provided white color luminescence through a color filter to thereby achieve luminescence of red, green, blue.

Although there are various methods of achieving white color luminescence, a case of using a luminescent layer comprising a high molecular material formable by coating will be explained here. In this case, doping of a color pigment to the high molecular material for constituting a luminescent layer can be carried out by preparing a solution and can extremely easily be achieved in comparison with a vapor deposition method for carrying out common vapor deposition for doping a plurality of color pigments.

Specifically, after coating an aqueous solution of poly(ethylenedioxythiophene)/poly (stylenesulfonic acid) (PEDOT/PSS) operated as a hole injecting layer over an entire face of an anode comprising a metal having large work function (Pt, Cr, W, Ni, Zn, Sn, In), thereafter coating and sintering a polyvinyl carbazole (PVK) solution doped with a luminescent core pigment (1,1,4,4-tetraphenyl 1,3-butadience (TPB), 4-dicyanomethylene-2-methyl-6-(p-dimethylaminostyryl)-4H-pyran(DCM1), Nile red, coumarin 6 or the like) operating as the luminescent layer over the entire face, a cathode comprising a laminated layer of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) laminated thereabove is formed. Further, PEDOT/PSS uses water as a solvent and is not dissolved in an organic solvent. Therefore, even when PVK is coated thereabove, there is no concern of dissolving again. Further, kinds of solvents of PEDOT/PSS and PVK differ from each other and therefore, it is preferable that the same film forming chamber is not used therefor.

Further, although an example of laminating organic compound layers is shown in the above-described example as shown by FIG. 4B, as shown by FIG. 4A, a single layer of an organic compound layer can be constituted. For example, 1, 3, 4-oxadiazole derivative (PBD) having electron transporting performance may be dispersed in polyvinyl carbazole (PVK) having hole transporting performance. Further, white color luminescence is achieved by dispersing 30 wt % of PBD as an electron transporting agent and dispersing pertinent amounts of four kinds of color pigments (TPB, coumarin 6, DCM1, Nile red).

Further, the organic compound film is formed between the anode and the cathode and by recombining holes injected from the anode and electrons injected from the cathode at the organic compound film, white color luminescence is achieved in the organic compound film.

Further, it is also possible to achieve white color luminescence as a whole by pertinently selecting an organic compound film for carrying out red color luminescence, an organic compound film for carrying out green color luminescence and an organic compound film for carrying out blue color luminescence and laminating the films to mix color.

The organic compound film formed as described above can achieve white color luminescence as a whole.

By forming color filters respectively provided with the coloring layer (R) for absorbing other than red color luminescence, a coloring layer (G) for absorbing green color luminescence and the coloring layer (B) for absorbing other than blue color luminescence in a direction of carrying out white color luminescence by the organic compound film, white color luminescence from the luminescent element can respectively be separated to achieve red color luminescence, green color luminescence and blue color luminescence. Further, in the case of an active matrix type, a structure in which TFT is formed between the substrate and the color filter is constituted.

Further, starting from simplist stripe pattern, skewed mosaic alignment, triangular mosaic alignment, RGBG four pixels alignment or RGBW four pixels alignment can be used for the coloring layer (R, G, B).

Figure 14:
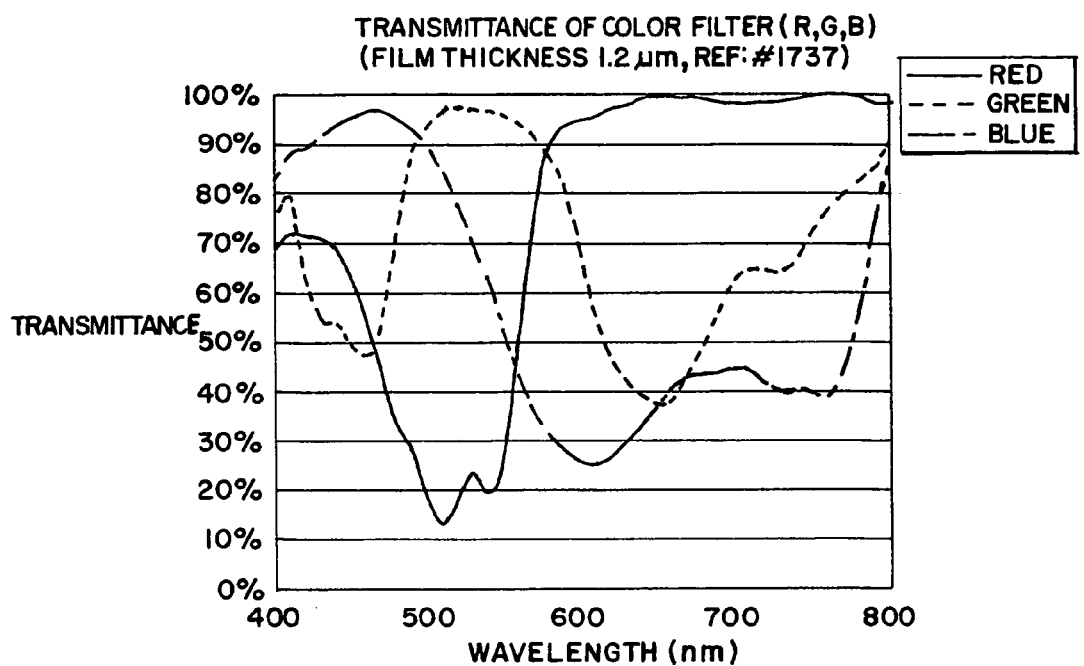
FIG. 14 is a diagram showing transmittance of a coloring layer (Embodiment 4)
Figure 15:
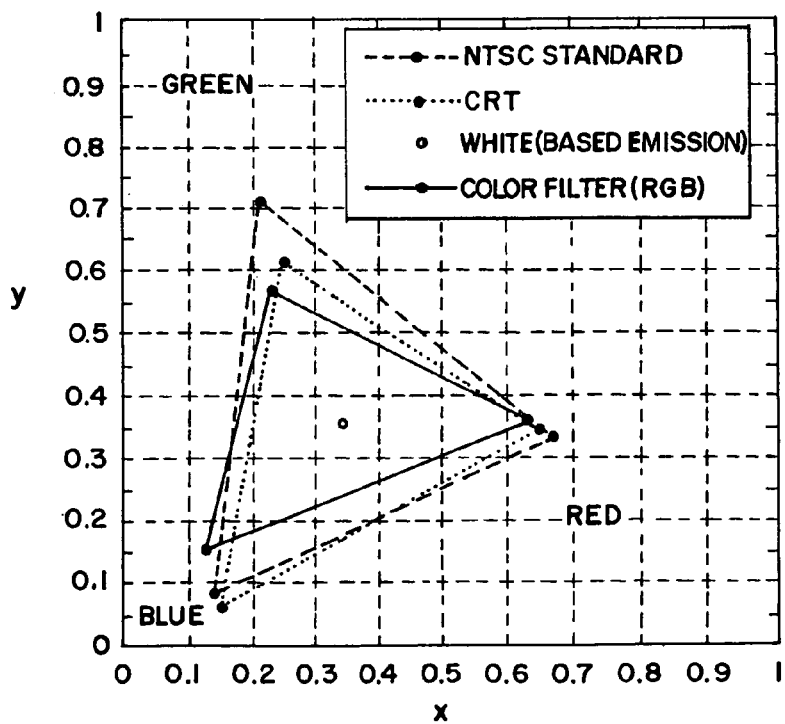
FIG. 15 is a diagram showing coordinates of chromaticity (Embodiment 4)

FIG. 14 shows an example of a relationship of transmittance and wavelength of each coloring layer by using white color light source (D65). A coloring layer for constituting a color filter is formed by using a color resist comprising an organic photosensitive material dispersed with a pigment. Further, FIG. 15 shows a color reproducing range in the case of combining white color luminescence and a color filter as chromaticity coordinates. Further, chromaticity coordinates of white color luminescence is (x, y)=(0.34, 0.35). It is known from FIG. 14 that color reproducing performance as full color is sufficiently ensured.

Further, in this case, even when achieved luminescent color differs, the constitution is formed with all the organic compound films displaying white color luminescence and therefore, it is not necessary to form the organic compound film to coat to divide for each luminescent color. Further, a polarizer for a circularly polarized light for preventing mirror reflection is not particularly needed.

Next, a CCM (color changing mediums) method realized by combining a blue color luminescent element having a blue color luminescent organic compound film and a fluorescent color changing layer will be explained in reference to FIG. 5B.

According to the CCM method, the fluorescent color changing layer is excited by blue color luminescence emitted from the blue color luminescent element and color is changed by each color changing layer. Specifically, changing from blue color to red color by the color changing layer (B→R), changing from blue color to green color by the color changing layer (B→G) and changing from blue color to blue color by the color changing layer (B→B) (further, changing from blue color to blue color may not be carried out) are carried out to achieve red color, green color and blue color luminescence. Also in the case of the CCM method, the structure in which TFT is formed between the substrate and the color changing layer is constituted in the case of the active matrix type.

Further, also in this case, it is not necessary to form the organic compound films to coat to divide also in this case. Further, a polarizer for a circularly polarized light for preventing mirror reflection is not particularly needed.

Further, when the CCM method is used, since the color changing layer is florescent, the color changing layer is excited by external light and a problem of reducing contrast is posed and therefore, as shown by FIG. 5C, the contrast may be made conspicuous by mounting color filters.

Further, the embodiment can be combined with any of Embodiments 1 through 3.

(Embodiment 5)

According to the embodiment, an example which differs from Embodiment 4, specifically, a case of laminating a layer comprising a high molecular material and a layer comprising a low molecular material as organic compound layers as shown by FIG. 4C will be explained.

In the case of achieving white color luminescence, a high molecular material for constituting a hole injecting layer may be formed by a coating method, common vapor deposition may be carried out by a vapor deposition method, a color pigment having a luminescent color which is different from that of luminescence in a luminescent region may be doped into a hole transporting layer to thereby mix with the luminescent color from the luminescent region. By pertinently adjusting materials of the luminescent layer and the hole transporting layer, white color luminescence can be achieved as a whole. In this instance, the end faces of the organic compound layer comprising a polymer and the organic compound layer comprising a low molecular material coincide with each other.

Further, the invention is not limited to white color luminescence but is applicable to a colored luminescent element using at least one layer of a high molecular material as an organic compound layer. The organic compound layer comprising the high molecular material is selectively etched by plasma. In the present invention, the layer including at least one layer containing a polymer is selectively etched by plasma. For example, a polymer for constituting a hole injecting layer are formed by a coating method, then, a light emitting layer (red, green, or blue emission) comprising a low molecular material is selectively formed by a vapor deposition method using a vapor deposition mask, and then, the organic compound layer comprising a polymer and the organic compound layer comprising a low molecular material are selectively etched by plasma using a mask stimultaneously.

FIGS. 6A, 6B, 6C and 6D show examples of laminated structure of luminescent elements.

According to a laminated structure shown in FIG. 6A, an organic compound layer 702 laminated with a first organic compound layer 702a comprising a high molecular (species) material (polymer) and a second organic compound layer 702b comprising a low molecular (species) material, a cathode buffer layer 703, and a cathode 704 are formed over an anode 701. By pertinently setting materials and film thicknesses of the layers interposed by the cathode and the anode, luminescent elements of red color, green color and blue color can be provided.

In the case of providing a red color luminescent element, as shown by FIG. 6B, PEDOT/PSS constituting a high molecular species material is coated on the anode comprising ITO by spin coating and sintered by baking in vacuum to constitute a film thickness of 30 nm. Successively, 4,4-bis[N-(1-naphtyl)-N-phenyl-amino]-biphenyl (hereinafter, indicated by α-NPD) is formed by a vapor deposition method by a film thickness of 60 nm. Successively, tris(8-quinolinolato) aluminum (hereinafter, indicated as $Alq_3$) including DCM as a dopant is formed by a vapor deposition method by a film thickness of 40 nm. Successively, $Alq_3$ is formed by a film thickness of 40 nm. Successively, $CaF_2$ is formed by a film thickness of 1 nm by a vapor deposition method and thereafter, Al is finally formed by a film thickness of 200 nm by a sputtering method or a vapor deposition method to thereby finish a red color luminescent element.

Further, in the case of providing a green color luminescent element, as shown by FIG. 6C, PEDOT/PSS constituting a high molecular species material is coated on the cathode comprising ITO by spin coating and sintered by baking in vacuum to constitute a film thickness of 30 nm. Successively, 4,4'-bis[N-(1-naphtyl)-N-phenyl-amino]-biphenyl (hereinafter, referred to as α-NPD) is formed by a film thickness of 60 nm by a vapor deposition method. Successively, tris(8-quinolinolato) aluminum (hereinafter, indicated as Alq 3) including DMQD as a dopant is formed by a film thickness of 40 nm by a vapor deposition method. Successively, $Alq_3$ is formed by a film thickness of 40 nm. Successively, $CaF_2$ is formed by a film thickness of 1 nm by a vapor deposition method and finally Al is formed by a film thickness of 200 nm by a sputtering method or a vapor deposition method to thereby finish a green color luminescent element.

Further, in order to provide a blue color luminescent element, as shown by FIG. 6D, PEDOT/PSS constituting a high molecular species material is coated on the cathode comprising ITO by spin coating, and sintered by baking in vacuum to constitute a film thickness of 30 nm. Successively, 4,4'-bis[N-(1-naphtyl)-N-phenyl-amino]-biphenyl (hereinafter, indicated as α-NPD) is formed by a film thickness of 60 nm by a vapor deposition method. Successively, pasocuploin (hereinafter, indicated as BCP) is formed by a film thickness of 10 nm as a dopant by a vapor deposition method. Successively, $Alq_3$ is formed by a film thickness of 40 nm. Successively, $CaF_2$ is formed by a film thickness of 1 nm by a vapor deposition method and thereafter, finally Al is formed by a film thickness of 200 nm by a sputtering method or a vapor deposition method to thereby finish the blue color luminescent element.

Further, the embodiment can be combined with any of embodiments 1 through 4.

The invention comprising the above-described constitution will be explained more in details by examples shown below.

EXAMPLES

Example 1

According to the example, FIG. 7 shows an example of a fabricating apparatus of a multi-chamber system fully automating fabrication up to an upper electrode.

In FIG. 7, notations 100a through 100k, 100m through 100w designate gates, notation 101 designates a input chamber, notation 119 designates an output chamber, notations 102, 104a, 108, 114, 118 designate transport chambers, notations 105, 107, 111 designate delivery chambers, notations 106R, 106B, 106G, 106H, 106E, 109, 110, 112, 113 designate film forming chambers, notation 103 designates a pretreatment chamber, notation 117 designates a sealed substrate load chamber, notation 115 designates a dispenser chamber, notation 116 designates a seal chamber, notations 120a, 120b designate cassette chambers, notation 121 designates tray mount stage, notation 122 designates an etching chamber by plasma.

First, an aqueous solution of poly(ethylenedioxythiophene)/poly(stylene sulfonic acid) (PEDOT/PSS) operated as a hole injecting layer is formed over an entire face of a substrate previously provided with an insulating substance for covering end portions of a plurality of TFTs, a cathode and an anode and a heating treatment is carried out in vacuum to thereby vaporize moisture.

A procedure of forming the laminated structure shown in FIG. 4B by carrying the substrate previously provided with the insulating substance for covering TFTs, the cathode and the anode and the hole injecting layer (PEDOT) into the fabricating apparatus shown in FIG. 7 will be described as follows.

First, the substrate is set to the cassette chamber 120a or the cassette chamber 120b. When the substrate is a large-sized substrate (for example, 300 mm×360 mm), the substrate is set to the cassette chamber 120b, when the substrate is a normal substrate (for example, 127 mm×127 mm), the substrate is carried to the tray mount stage 121 and several sheets of the substrates are mounted on a tray (for example, 300 mm×360 mm).

Successively, the substrate is transported from the transport chamber 118 provided with a substrate transport mechanism to the input chamber 101.

It is preferable that the input chamber 101 is connected to a vacuuming treatment chamber, vacuumed, thereafter introduced with inert gas and subjected to the atmospheric pressure. Successively, the substrate is transported to the transport chamber 102 connected to the input chamber 101. Inside of the transport chamber is previously maintained in vacuum by vacuuming as much as possible such that moisture or oxygen is not present.

Further, the transport chamber 102 is connected with a vacuuming treatment chamber for vacuuming inside of the transport chamber. The vacuuming treatment chamber is provided with a turbo-molecular pump of a magnetic levitation type, a cryopump or a dry pump. Thereby, the ultimate vacuuming degree of the transport chamber can be made to be $10^{-5}$ through $10^{-6}$ Pa and inverse diffusion of impurities from a pump side and an exhaust system can be controlled. In order to prevent impurities from being introduced to the apparatus, as a gas to be introduced, an inert gas of nitrogen or rare gas is used. As a gas to be introduced into the apparatus, a gas highly purified by a gas refining machine before being introduced into the apparatus is used. Therefore, the gas refining machine needs to be provided such that the gas is introduced into the film forming apparatus after having been highly purified. Thereby, oxygen, water and other impurities included in the gas can previously be removed and therefore, impurities can be prevented from being introduced into the apparatus.

Successively, the high molecular organic compound layer for constituting the luminescent layer is formed over an entire face of the hole injecting layer (PEDOT) provided over the entire face. The film forming chamber 112 is a film forming chamber for forming the high molecular organic compound layer. According to the embodiment, there is shown an example of forming a solution of polyvinyl carbazole (PVK) doped with a pigment (1,1,4,4-tetraphenyl 1,3-butadiene (TPB), 4-dicyanomechylene-2-methyl-6-(p-dimethyl-aminostyryl)-4H-pyran (DCM1), Nile red, coumarin 6 or the like) operating as an luminescent layer over the entire face. When the organic compound layer is formed by a spin coating method in the film forming chamber 112, a face of the substrate to be formed with a film under the atmospheric pressure is set to direct upwardly. According to the embodiment, the delivery chamber 105 is provided with a substrate inverting mechanism to pertinently invert the substrate. After forming the film by using water or an organic dissolving agent as a solvent, it is preferable to transfer the substrate to the pretreatment chamber 103 at which a heating treatment in vacuum is carried to vaporized moisture.

Although according to the embodiment, an example of laminating the organic compound layer comprising the high molecular material is shown, when a laminated structure for laminating with the low molecular material layer shown by FIG. 4C or FIGS. 6A, 6B, 6C and 6D is constituted, film forming may be carried out pertinently at the film forming chambers 106R, 106G, 106B by a vapor deposition method and the organic compound layer displaying luminescence of white color, or red color, green color, blue color may pertinently be formed as a total of the luminescent element. Further, as necessary, pertinently, the electron transporting layer or the electron injecting layer may be formed at the film forming chamber 106E and the hole injecting layer or the hole transporting layer may be formed at the film forming chamber 106H. When a vapor deposition method is used, for example, vapor deposition is carried out in the film forming chamber vacuumed to constitute the vacuuming degree equal to or lower than $5\times10^{-3}$ Torr (0.665Pa), preferably, $10^{-4}$ through $10^{-6}$ Pa. In vapor deposition, previously, the organic compound is vaporized by resistance heating and scattered in the direction of the substrate by opening a shutter (not illustrated) in vapor deposition. The vaporized organic compound is scattered to an upper side and is vapor-deposited to the substrate by passing an opening portion (not illustrated) provided at the metal mask (not illustrated). Further, in vapor deposition, temperature ($T_1$) of the substrate is set to 50 through 200° C., preferably, 65 through 150° C. by means for heating the substrate. Further, when a vapor deposition method is used, it is preferable to set a crucible contained with vapor deposition materials previously by a material maker in the film forming chamber. When the crucible is set, it is preferable to set the crucible without being in contact with the atmosphere and when the crucible is carried from the material maker, it is preferable to introduce the crucible into the vacuum forming chamber in a state of being hermetically closed in a vessel. Preferably, a chamber having vacuuming means is provided to connect to the film forming chamber 106R, the crucible is taken out from the second vessel in vacuum or an inert gas atmosphere and the crucible is installed to the film forming chamber. Thereby, the crucible and the EL material contained in the crucible can be prevented from being contaminated.

Successively, after transporting the substrate from the transport chamber 102 to the delivery chamber 105, from the delivery chamber 105 to the transport chamber 104a and from the transport chamber 104a to the delivery chamber 107 without being in contact with the atmosphere, the substrate is further transported from the delivery chamber 107 to the transport chamber 108 without being in contact with the atmosphere.

Successively, by a transporting mechanism installed in the transport chamber 108, the substrate is transported to the plasma treatment chamber and the laminated layer of the organic compound film comprising the high molecular material is selectively removed by using the metal mask. The plasma treatment chamber 122 includes plasma generating means and carries out dry etching by generating plasma by exciting a single kind or a plurality of kinds of gases selected from the group constituting of Ar, H, F and O. When etching is carried out by an oxygen plasma treatment, the etching can also be carried out at the pretreatment chamber 103.

Successively, by the transfer mechanism installed in the transfer chamber 108, the substrate is transferred to the film forming chamber 110 and the cathode (lower layer) comprising a very thin metal film (film formed by alloy of MgAg, MgIn, AlLi, CaN or the like, or element belonging to 1 group or 2 group of the periodic table and aluminum by a common vapor deposition method) is formed by a vapor deposition method using resistance heating. After forming the cathode (lower layer) comprising the thin metal layer, the substrate is transported to the film forming chamber 109 and formed with the cathode (upper layer) comprising the transparent conductive film (ITO (indium oxide indium tin alloy), indium oxide zinc oxide ($In_2O_3$—ZnO), zinc oxide (ZnO or the like) by a sputtering method and pertinently formed with the cathode comprising the laminated layer of the thin metal layer and the transparent conductive film.

By the above-described steps, the luminescent element having the laminated structure shown in FIG. 4B is formed.

Successively, the substrate is transported from the transport chamber 108 to the film forming chamber 113 without being in contact with the atmosphere and formed with the protective film comprising a silicon oxide film or a silicon oxynitride film. Here, a sputtering apparatus having a target comprising silicon, a target comprising silicon oxide or a target comprising silicon nitride is constituted in the film forming chamber 113. For example, a silicon nitride film can be formed by using a target comprising silicon and constituting an atmosphere of the film forming chamber by an atmosphere of nitrogen or an atmosphere including nitrogen and argon.

Successively, the substrate formed with the luminescent element is transported from the transport chamber 108 to the delivery chamber 111 without being in contact with the atmosphere and transported from the delivery chamber 111 to the transport chamber 114.

Successively, the substrate formed with the luminescent element is transported from the transport chamber 114 to the seal chamber 116. Further, it is preferable to prepare the seal substrate provided with the seal member in the seal chamber 116.

The seal substrate is set from outside to the seal substrate load chamber 117a. Further, it is preferable to previously carry out annealing in vacuum, for example, in the seal substrate load chamber 117 to remove impurities such as moisture. Further, when the seal member is formed at the seal substrate, the transfer chamber 108 is brought into the atmospheric pressure, thereafter, the seal substrate is transferred from the seal substrate load chamber to the dispenser chamber 115, the seal member for pasting on the substrate provided with the luminescent element is formed and the seal substrate formed with the seal member is transferred to the seal chamber 116.

Successively, in order to degas the substrate provided with the luminescent element, the substrate is annealed in vacuum in an inert atmosphere and the seal substrate provided wit the seal member and the substrate formed with the luminescent element are pasted together. Further, hydrogen or an inert gas is filled in a hermetically closed space. Further, although an example of forming the seal member at the seal substrate is shown here, the invention is not particularly limited thereto but the seal member may be formed at the substrate formed with the luminescent element.

Successively, the pair of substrates pasted together are irradiated with UV light by an ultraviolet ray irradiating mechanism provided at the seal chamber 116 to thereby cure the seal member. Further, although an ultraviolet ray curing resin is used here as the seal member, the seal member is not limited so far as the seal member is an adhering member.

Successively, the pair of substrates pasted together are transferred from the seal chamber 116 to the transfer chamber 114 and from the transfer chamber 114 to the output chamber 119 to output.

As described above, by using the fabricating apparatus shown in FIG. 8, the luminescent element is not exposed to outside air until sealed into the hermetically-closed space and therefore, the highly reliable light emitting apparatus can be fabricated. Further, although in the transfer chamber 114, vacuum and a nitrogen atmosphere under the atmospheric pressure are repeated, it is preferable to always maintain vacuum at the transfer chambers 102, 104a, 108.

Further, it is also possible to constitute a film forming apparatus of an ink-line system.

Further, a procedure of carrying a substrate into the fabricating apparatus shown in FIG. 7, using a transparent conductive film as an anode and forming a luminescent element (FIGS. 6A, 6B, 6C, 6D) having a light emitting direction reverse to that in the above-described laminating structure will be described.

First, a substrate provided with TFTs and an anode is set to the cassette chamber 120a or the cassette chamber 120b.

Successively, the substrate is transported from the transport chamber 118 provided with the substrate transporting mechanism to the input chamber 101. Successively, the substrate is transported to the transport chamber 102 connected to the input chamber 101.

Further, in order to remove moisture or other gas included in the substrate, it is preferable to carry out annealing for degassing in vacuum and the substrate may be transported to the pretreatment chamber 103 connected to the transfer chamber 102 to carry out annealing in the pretreatment chamber 103. Further, when the surface of the anode needs to clean, the substrate may be transported to the pretreatment chamber 103 connected to the transport chamber 102 to clean the surface of the anode at the pretreatment chamber 103.

Successively, the high molecular organic compound layer is formed over the entire face of the anode. The film forming chamber 112 is a film forming chamber for forming the high molecular organic compound layer. For example, an aqueous solution of poly(ethylenedioxythiophene)/poly(stylenesulfonic acid) (PEDOT/PSS) operated as the hole injecting layer is formed over the entire face. When the organic compound layer is formed by a spin coating method in the film forming chamber 112, a face of the substrate to be formed with the film is set to direct upwardly under the atmospheric pressure. The delivery chamber 105 is provided with the substrate inverting mechanism for pertinently inverting the substrate. Further, after forming the film by using the aqueous solution, it is preferable to transport the substrate to the pretreatment temperature 103 and vaporize moisture by carrying out the heating treatment in vacuum at the pretreatment chamber 103.

Successively, the substrate 104c is transported from the transport chamber 102 to the delivery chamber 105, thereafter the substrate 104c is transported to the transport chamber 104 and transported to the film forming chamber 106R by the transporting mechanism 104b and the EL layer for achieving luminescence of red color is pertinently formed on the hole injecting layer comprising the high molecular material provided on the anode. The EL layer is formed by vapor deposition using resistance heating in this case.

In this case, to constitute full color, after forming the film at the film forming chamber 106R, successively, the film is formed at the respective film forming chambers 106G, 106B and the organic compound layer displaying luminescence of red color, green color, blue color is pertinently formed. The organic compound layer may successively be formed to constitute the laminated structure shown in FIGS. 6A, 6B, 6C and 6D representatively.

When the hole injecting layer and the desired EL layer is provided on the anode in this way, successively, the substrate is transported from the transport chamber 104a to the delivery chamber 107 without being in contact with the atmosphere and thereafter, the substrate is transported from the delivery chamber 107 to the transport chamber 108 without being in contact with the atmosphere.

Successively, by the transporting mechanism installed in the transport chamber 108, the substrate is transported to the film forming chamber 110 and the cathode comprising the metal layer is pertinently formed by the vapor deposition method by resistance heating. Here, the film forming chamber 110 is constituted by a vapor deposition apparatus having Li and Al at a vapor deposition source for vapor-depositing by resistance heating.

The luminescent element having the laminated structure shown by FIGS. 6A, 6B, 6C, 6D is formed by the above-described steps.

Further, steps thereafter are the same as the procedure of fabricating the light emitting apparatus having the laminating structure shown in FIG. 4B and therefore, an explanation thereof will be omitted.

When the fabricating apparatus shown in FIG. 7 is used in this way, the laminated structures shown in FIG. 4B and FIGS. 6A, 6B, 6C, 6D can be fabricated.

Further, the example can freely be combined with any of embodiments 1 through 5.

Example 2

According to the example, an example of fabricating a structure in which light emitted from an EL element transmits through an element substrate and emitted to enter eyes of an observer will be shown below. Further, in this case, the observer can recognize an image from the side of the element substrate.

Further, a pixel structure arranged with three TFTs at a single pixel will be explained. Further, FIGS. 9A and 9B show an example of a detailed top view of a pixel.

A constitution shown by FIGS. 9A and 9B is provided with an erasing transistor 606 in the case of carrying out SES driving, a gate electrode and a second gate signal line 603 for inputting a signal for erasing are connected. A source electrode and-current supply line 604 are connected, and a drain electrode and a drain electrode of a switching TFT 656 and a gate electrode of driving TFT 607 are connected.

In the case of a three transistor type, two TFTs of the switching TFT 605 and erasing TFT 606 are arranged linearly by being aligned transversely between a first gate signal line 602 and the second gate signal line 603. The drain region of the switching TFT 605 and the drain region of the erasing TFT 606 may be overlapped. In this case, a certain point of the source region and a certain point of the drain region of the switching TFT 605 and a certain point of the source region and a certain point of the drain region of the erasing TFT 606 are arranged to align on one straight line.

By arranging these as described above, numeral aperture can be increased and an opening portion can be constituted by a simple shape.

FIG. 9B shows a section between $\alpha$ and $\alpha'$ in FIG. 9A. A semiconductor layer may be meandered in a vertical direction as in the driving TFT 607. By constituting the semiconductor layer by such a shape, the channel length of the driving TFT 607 can be prolonged without reducing the numerical aperture.

Further, FIGS. 11A and 11B explain an outlook view of an active matrix type light emitting apparatus. Further, FIG. 11A is a top view showing the light emitting apparatus and FIG. 11B is a sectional view constituted by cutting FIG. 11A by a line A–A'. Notation 901 indicated by a dotted line designates a source signal line driving circuit, notation 902 designates a pixel portion, and notation 903 designates a gate signal line driving circuit. Further, notation 904 designates a seal substrate, notation 905 designates a seal agent and an inner side surrounded by the seal agent 905 constitutes a space 907.

Further, notation 908 designates a wiring for transmitting signals inputted to the source signal line driving circuit 901 and the gate signal line driving circuit 903 for receiving a video signal or a clock signal from FPC (flexible printed circuit) 909 for constituting an external input terminal. Further, although only FPC is illustrated here, the FPC may be attached with a printed wiring board (PWB). The light emitting apparatus in the specification includes not only a main body of the light emitting apparatus but also a state in which FPC or PWB is attached thereto.

Next, a sectional structure will be explained in reference to FIG. 11B. Drive circuits and the pixel portion are formed over a substrate 910 and here, the source signal line driving circuit 901 as the drive circuit and the pixel portion 902 are shown.

Further, the source signal line driving circuit 901 is formed with a CMOS circuit combined with an n-channel type TFT 906 and a p-channel type TFT 915. Further, TFT for forming the drive circuit may be formed by a publicly-known CMOS circuit, PMOS circuit or NMOS circuit. Further, although according to the embodiment, a driver integrated type formed with the drive circuits over the substrate is shown, the driver integrated type is not necessarily be needed and the drive circuits can be formed not over the substrate but at outside thereof.

Further, the pixel portion 902 is formed by a plurality of pixels each including a current controlling TFT 911 and a first electrode (anode) 912 electrically connected to a drain thereof.

Further, an insulating layer 913 is formed at both ends of the first electrode (anode) 912 and an organic compound layer 914 is formed over the first electrode (anode) 912. Further, a second electrode (cathode) 916 is formed over the organic compound layer 914. Thereby, a luminescent element 918 comprising the first electrode (anode) 912, the organic compound layer 914 and the second electrode (cathode) 916 is formed. Further, an auxiliary electrode 917 is provided over the second electrode 916. Here, the luminescent element 918 shows an example of white color luminescence and therefore, provided with the color filter comprising a coloring layer 920a and BM 920b (for simplification, overcoat layer is not illustrated here). Notation 919 is a switching TFT.

The second electrode (cathode) 916 functions also as a wiring common to all the pixels and electrically connected to FPC 909 via the connection wiring 908.

Further, in order to seal the luminescent element 918 formed over the substrate 910, the seal substrate 904 is pasted by the seal agent 905. Further, a spacer comprising a resin film may be provided for ensuring an interval between the seal substrate 904 and the luminescent element 918. Further, the space 907 on the inner side of the seal agent 905 is filled with an inert gas of nitrogen or the like. Further, it is preferable to use epoxy species resin for the seal agent 905. Further, it is preferable that the seal agent 905 is a material for permeating moisture or oxygen as less as possible. Further, the inner portion of the space 907 may be included with the substance having an effect of absorbing oxygen of water.

Further, according to the embodiment, as a material for constituting the seal substrate 904, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the seal agent 905 and thereafter seal to cover a side face (exposed face) by a seal agent.

By sealing the luminescent element in the space 907 as described above, the luminescent element can completely be blocked from outside and a substance for expediting to deteriorate the organic compound layer such as moisture or oxygen can be prevented from invading from outside. Therefore, the highly reliable light emitting apparatus can be provided.

Figure 10A:
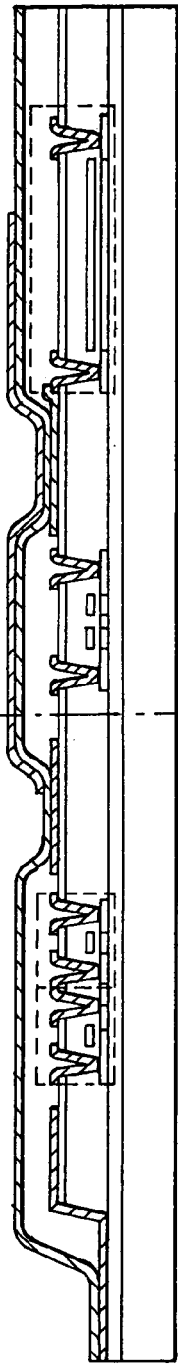
FIGS. 10A, 10B and 10C are views showing step diagrams (Embodiment 2)
Figure 10B:
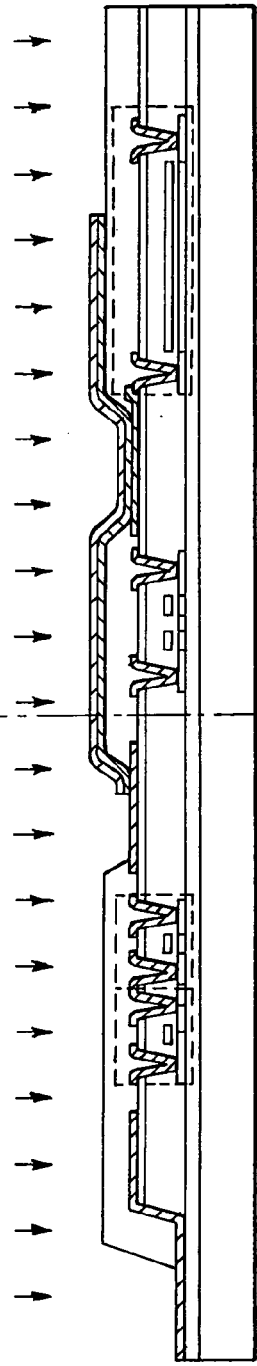
Figure 10C:
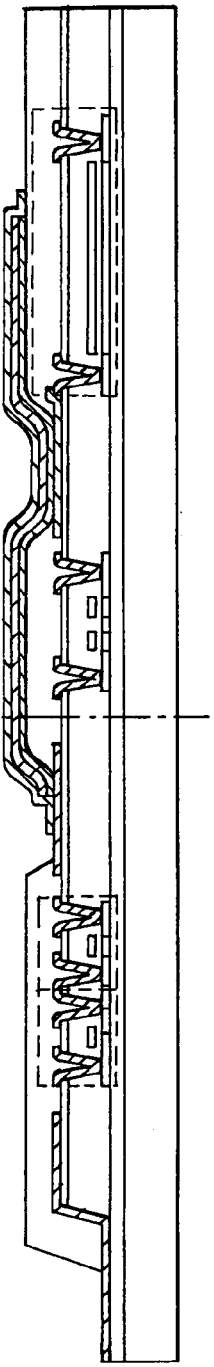

Further, FIGS. 10A, 10B and 10C show an example of steps of fabricating the above-described structure.

FIG. 10A is a sectional view at a stage of selectively forming the second electrode (cathode comprising Li—Al) by a vapor deposition mask after forming the organic compound film (laminated layer including PEDOT) by a coating method. Further, for simplification, a method of fabricating an anode comprising the transparent conductive film and TFT will be omitted here.

Next, FIG. 10B is a sectional view at a stage of etching the organic compound film (laminated layer including PEDOT) by plasma self-adjustingly by constituting a mask by the second electrode.

Next, FIG. 10C is a sectional view at a stage of selectively forming a third electrode to connect to the connection wiring. Further, the second electrode and the third electrode may be constituted by a same material or a material having a lower resistivity may be used for the third electrode.

Further, the embodiment can freely be combined with embodiments 1 through 5 and Example 1.

Example 3

By carrying out the invention, all of electronic apparatus integrated with a module having an organic luminescent element (active matrix type EL module) are completed.

As such electronic apparatus, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 12A, 12B, 12C, 12D, 12E and 12F and FIGS. 13A, 13B and 13C show examples of these.

Figure 12A:
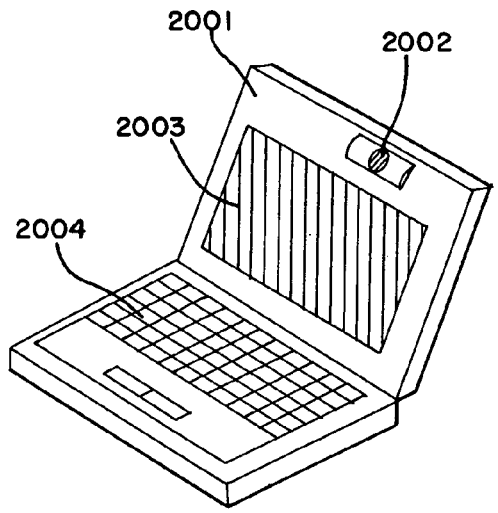
FIGS. 12A, 12B, 12C, 12D, 12E and 12F are views showing examples of electronic apparatus.

FIG. 12A is a personal computer which includes a main body 2001, an image input portion 2002, a display portion 2003 and a keyboard 2004.

Figure 12B:
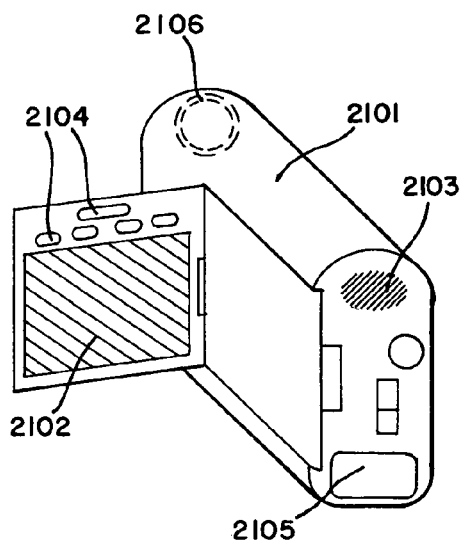

FIG. 12B is a video camera which includes a main body 2101, a display portion 2102, a voice input portion 2103, an operation switch 2104, a battery 2105, an image receiving portion 2106.

Figure 12C:
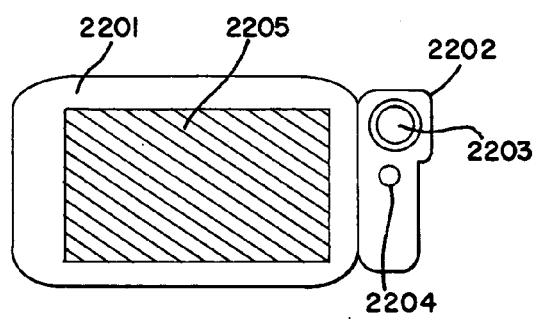

FIG. 12C is a mobile computer which includes a main body 2201, a camera portion 2202, an image receiving portion 2203, an operation switch 2204 and a display portion 2205.

Figure 12D:
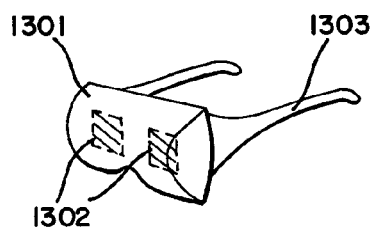

FIG. 12D is a goggle type display which includes a main body 2301, a display portion 2302 and an arm portion 2303.

Figure 12E:
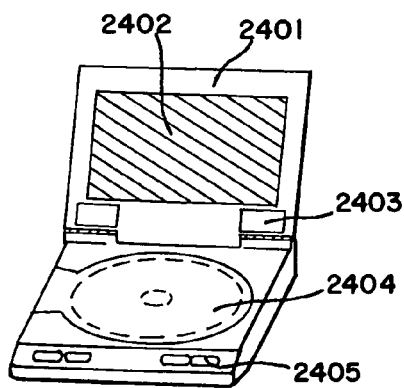

FIG. 12E is a player using a record medium recorded with programs (hereinafter, referred to as record medium) which includes a main body 2401, a display portion 2402, a speaker portion 2403, a record medium 2404 and an operation switch 2405. Further, the player uses DVD (Digital Versatile Disc) or CD as a record medium and can enjoy music, enjoy movie and carry out the game or the internet.

Figure 12F:
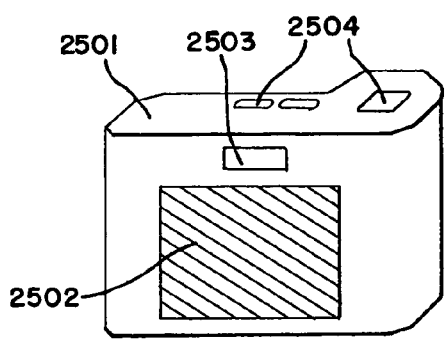

FIG. 12F is a digital camera which includes a main body 2501, a display portion 2502, an eye-piece portion 2503, an operation switch, 2504 and an image receiving portion (not illustrated).

Figure 13A:
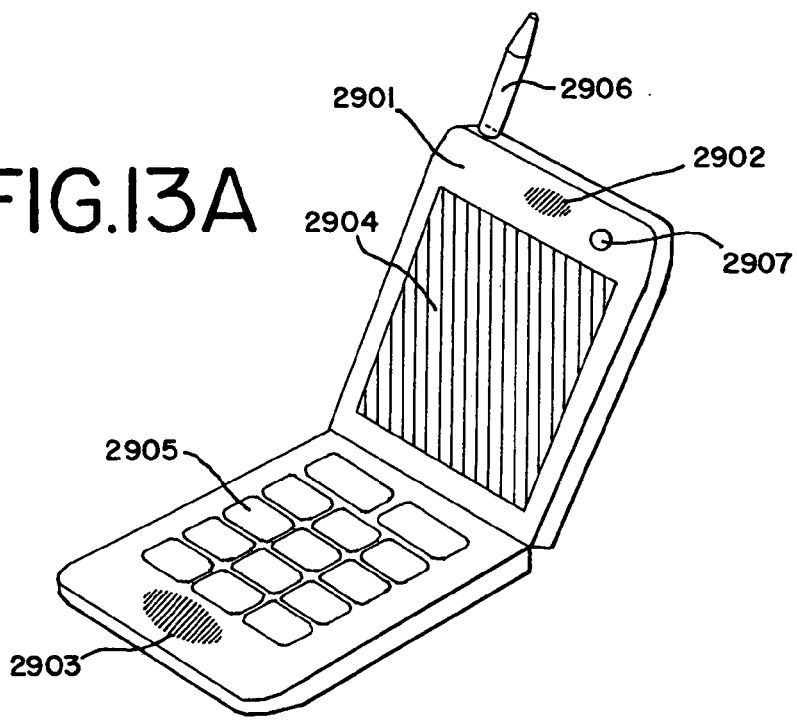
FIGS. 13A, 13B and 13C are views showing examples of electronic apparatus.

FIG. 13A is a portable telephone which includes a main body 2901, a voice output portion 2902, a voice input portion 2903, a display portion 2904, an operation switch 2905, an antenna 2906 and an image input portion (CCD, image sensor) 2907.

Figure 13B:
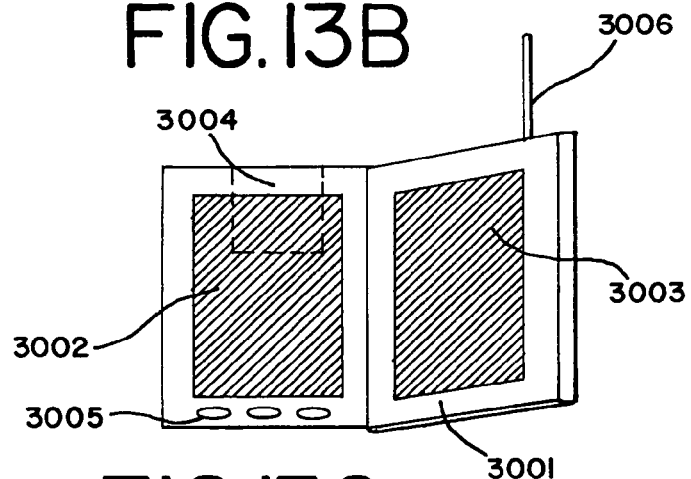

FIG. 13B is a portable book (electronic book) which includes a main body 3001, display portions 3002, 3003, a record medium 3004, an operation switch 3005, an antenna 3006.

Figure 13C:
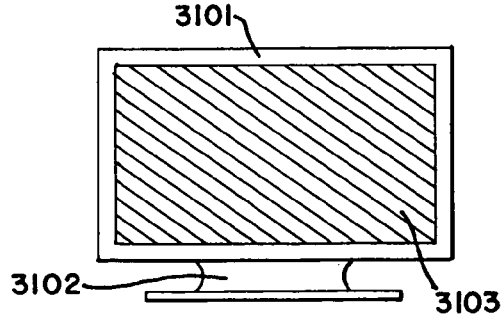

FIG. 13C is the display which includes a main body 3101, a support base 3102 and a display portion 3103.

Incidentally, the display shown in FIG. 13C is of a screen size of middle or small type or large type, for example, a screen size of 5 through 20 inches. Further, in order to form the display portion of this size, it is preferable to use a display portion having a side of a substrate of 1 m and carry out mass production by taking many faces.

As described above, a range of applying the invention is extremely wide and is applicable to a method of fabricating electronic apparatus of all the fields. Further, the electronic apparatus of the embodiment can be realized by using a constitution comprising any combination of the embodiments 1 through 5, Example 1 or Example 2.

By enabling to selectively form the high molecular species material layer by the invention, the structure in which the organic compound layer is not formed at the connection portion of the wiring connected to an outside power source can simply be formed.

Further, by providing the color filter by the invention, a polarizer for circularly polarized light is dispensed with, the cost is reduced and coating to divide is not necessary and therefore, promotion of the through put and highly fine formation can be realized.

What is claimed is:
1. A light emitting apparatus comprising a drive circuit, a terminal portion and a pixel portion, said pixel portion having a plurality of luminescent elements over a first substrate having an insulating surface:

wherein each of said plurality of luminescent elements comprises a first electrode, a layer comprising an organic compound over the first electrode, and a second electrode over the layer comprising the organic compound;

wherein an end portion of the first electrode is covered by an insulating substance, a side face of the insulating substance including a curved face having a first radius of curvature and a curved face having a second radius of curvature;

wherein the layer comprising the organic compound is provided over the insulating substance and the first electrode; and wherein a third electrode is in contact with the insulating substance.

2. The light emitting apparatus according to claim 1, wherein a second substrate having a light transmitting performance is over said plurality of luminescent elements.

3. The light emitting apparatus according to claim 2, wherein said layer comprising said organic compound comprises a material which is luminescent in white color and combined with a color filter provided at the second substrate.

4. The light emitting apparatus according to claim 2, wherein said layer comprising said organic compound comprises a material of emitting light of a single color and combined with at least a color changing layer and a coloring layer provided at the second substrate.

5. The light emitting apparatus according to claim 2, wherein an interval between the first substrate and the second substrate is in a range of 2 µm through 30 µm.

6. The light emitting apparatus according to claim 2, wherein a light emitted from each of said plurality of luminescent elements transmits through said second substrate.

7. The light emitting apparatus according to claim 1, wherein the layer comprising the organic compound comprises a polymer.

8. The light emitting apparatus according to claim 1, wherein said layer comprising said organic compound is a laminated layer of a layer comprising a polymer and a layer comprising a low molecular material.

9. The light emitting apparatus according to claim 1, wherein an upper end portion of the insulating substance is the curved face having the first radius of curvature, a lower end portion of the insulating substance is the curved face having the second radius of curvature, and the first radius of curvature and the second radius of curvature is in a range of 0.2 µm through 3 µm.

10. The light emitting apparatus according to claim 1, wherein a second substrate is over said plurality of luminescent elements; and wherein the second substrate includes a recessed portion and a drying agent is provided at the recessed portion.

11. The light emitting apparatus according to claim 1, wherein a second substrate is over said plurality of luminescent elements; and wherein the second substrate includes a recessed portion provided with a drying agent and the recessed portion overlaps the drive circuit provided over the first substrate.

12. The light emitting apparatus according to claim 1, wherein said layer comprising said organic compound comprises poly(ethylenedioxythiophene)/poly(stylenesulfonic acid).

13. The light emitting apparatus according to claim 1, wherein the light emitting apparatus is selected from the group consisting of a video camera, a digital camera, a goggle type display, a car navigation apparatus, a personal computer and a portable information terminal.

14. A light emitting apparatus comprising a drive circuit, a terminal portion and a pixel portion, said pixel portion having a plurality of luminescent elements over a first substrate having an insulating surface:

wherein each of said plurality of luminescent elements comprises a first electrode, a layer comprising an organic compound over the first electrode, and a second electrode over the layer comprising the organic compound;

wherein an end portion of the first electrode is covered by an insulating substance, a side face of the insulating substance including a curved face having a first radius of curvature and a curved face having a second radius of curvature;

wherein a third electrode is provided over the insulating substance; and wherein the layer comprising the organic compound is provided over the insulating substance and the first electrode.

15. The light emitting apparatus according to claim 14, wherein a second substrate having a light transmitting performance is over said plurality of luminescent elements.

16. The light emitting apparatus according to claim 15, wherein said layer comprising said organic compound comprises a material which is luminescent in white color and combined with a color filter provided at the second substrate.

17. The light emitting apparatus according to claim 15, wherein said layer comprising said organic compound comprises a material of emitting light of a single color and combined with at least a color changing layer and a coloring layer provided at the second substrate.

18. The light emitting apparatus according to claim 15, wherein an interval between the first substrate and the second substrate is in a range of 2 µm through 30 µm.

19. The light emitting apparatus according to claim 15, wherein a light emitted from each of said plurality of luminescent elements transmits through said second substrate.

20. The light emitting apparatus according to claim 14, wherein the layer comprising the organic compound comprises a polymer.

21. The light emitting apparatus according to claim 14, wherein said layer comprising said organic compound is a laminated layer of a layer comprising a polymer and a layer comprising a low molecular material.

22. The light emitting apparatus according to claim 14, wherein an upper end portion of the insulating substance is the curved face having the first radius of curvature, a lower end portion of the insulating substance is the curved face having the second radius of curvature, and the first radius of curvature and the second radius of curvature is in a range of 0.2 µm through 3 µm.

23. The light emitting apparatus according to claim 14, wherein a second substrate is over said plurality of luminescent elements; and wherein the second substrate includes a recessed portion and a drying agent is provided at the recessed portion.

24. The light emitting apparatus according to claim 14,
wherein a second substrate is over said plurality of luminescent elements; and
wherein the second substrate includes a recessed portion provided with a drying agent and the recessed portion overlaps the drive circuit provided over the first substrate.

25. The light emitting apparatus according to claim 14,
wherein said layer comprising said organic compound comprises poly(ethylenedioxythiophene)/poly(stylenesulfonic acid).

26. The light emitting apparatus according to claim 14,
wherein the light emitting apparatus is selected from the group consisting of a video camera, a digital camera, a goggle type display, a car navigation apparatus, a personal computer and a portable information terminal.

27. A light emitting apparatus comprising a drive circuit, a terminal portion and a pixel portion, said pixel portion having a plurality of luminescent elements over a first substrate having an insulating surface:
wherein each of said plurality of luminescent elements comprises a first electrode, a layer comprising an organic compound over the first electrode, and a second electrode over the layer comprising the organic compound;
wherein an end portion of the first electrode is covered by an insulating substance, a side face of the insulating substance including a curved face having a first radius of curvature and a curved face having a second radius of curvature;
wherein the layer comprising the organic compound is provided over the insulating substance and the first electrode; and
wherein a part of the layer comprising the organic compound is in contact with the insulating substance.

28. The light emitting apparatus according to claim 27,
wherein a second substrate having a light transmitting performance is over said plurality of luminescent elements.

29. The light emitting apparatus according to claim 28,
wherein said layer comprising said organic compound comprises a material which is luminescent in white color and combined with a color filter provided at the second substrate.

30. The light emitting apparatus according to claim 28,
wherein said layer comprising said organic compound comprises a material of emitting light of a single color and combined with at least a color changing layer and a coloring layer provided at the second substrate.

31. The light emitting apparatus according to claim 28,
wherein an interval between the first substrate and the second substrate is in a range of 2μm through 30μm.

32. The light emitting apparatus according to claim 28,
wherein a light emitted from each of said plurality of luminescent elements transmits through said second substrate.

33. The light emitting apparatus according to claim 27,
wherein the layer comprising the organic compound comprises a polymer.

34. The light emitting apparatus according to claim 27,
wherein said layer comprising said organic compound is a laminated layer of a layer comprising a polymer and a layer comprising a low molecular material.

35. The light emitting apparatus according to claim 27,
wherein an upper end portion of the insulating substance is the curved face having the first radius of curvature, a lower end portion of the insulating substance is the curved face having the second radius of curvature, and the first radius of curvature and the second radius of curvature is in a range of 0.2μm through 3μm.

36. The light emitting apparatus according to claim 27,
wherein a second substrate is over said plurality of luminescent elements; and
wherein the second substrate includes a recessed portion and a drying agent is provided at the recessed portion.

37. The light emitting apparatus according to claim 27,
wherein a second substrate is over said plurality of luminescent elements; and
wherein the second substrate includes a recessed portion provided with a drying agent and the recessed portion overlaps the drive circuit provided over the first substrate.

38. The light emitting apparatus according to claim 27,
wherein said layer comprising said organic compound comprises poly(ethylenedioxythiophene)/poly(stylenesulfonic acid).

39. The light emitting apparatus according to claim 27,
wherein the light emitting apparatus is selected from the group consisting of a video camera, a digital camera, a goggle type display, a car navigation apparatus, a personal computer and a portable information terminal.

40. A light emitting apparatus comprising a drive circuit, a terminal portion and a pixel portion, the pixel portion comprising a first luminescent element and a second luminescent element over a substrate,
wherein the first luminescent element comprises a first electrode, a first layer comprising an organic compound over the first electrode, and a part of a second electrode over the first layer comprising the organic compound,
wherein the second luminescent element comprises a fourth electrode, a second layer comprising an organic compound over the fourth electrode, and a part of the second electrode over the second layer comprising the organic compound,
wherein an insulating substance are over an end portion of the first electrode and an end portion of the fourth electrode,
wherein upper and lower end portions of a side face of the insulating substance are round, and
wherein a third electrode is between the first and second luminescent elements.

41. The light emitting apparatus according to claim 40,
wherein the second electrode comprises Mg and Ag.

42. The light emitting apparatus according to claim 40,
wherein the third electrode is above the first electrode.

43. The light emitting apparatus according to claim 40,
wherein the third electrode is not connected to the first electrode.

44. The light emitting apparatus according to claim 40,
wherein the first electrode is a single layer.

45. The light emitting apparatus according to claim 40,
wherein the second electrode is a single layer.

46. The light emitting apparatus according to claim 40,
wherein the light emitting apparatus is selected from the group consisting of a video camera, a digital camera, a goggle type display, a car navigation apparatus, a personal computer and a portable information terminal.

47. The light emitting apparatus according to claim 40,
wherein the organic compound of the first layer and the organic compound of the second layer are the same.

48. The light emitting apparatus according to claim 40,
wherein the upper end portion of the insulating substance has a first radius of curvature, and
wherein the lower end portion of the insulating substance has a second radius of curvature.

49. The light emitting apparatus according to claim 40,
wherein the upper end portion of the insulating substance has a first radius of curvature,
wherein the lower end portion of the insulating substance has a second radius of curvature, and
wherein the first radius of curvature and the second radius of curvature is in a range of 0.2μm though 3μm.

50. A light emitting apparatus comprising a drive circuit, a terminal portion and a pixel portion, the pixel portion comprising a first luminescent element and a second luminescent element over a substrate,
wherein the first luminescent element comprises a first electrode, a first layer comprising an organic compound over the first electrode, and a part of a second electrode over the first layer comprising the organic compound,
wherein the second luminescent element comprises a fourth electrode, a second layer comprising an organic compound over the fourth electrode, and a part of the second electrode over the second layer comprising the organic compound,
wherein an insulating substance is over an end portion of the first electrode and an end portion of the fourth electrode,
wherein upper and lower end portions of a side face of the insulating substance are round,
wherein a third electrode is between the first and second luminescent elements, and
wherein the third electrode is in contact with the insulating substance.

51. The light emitting apparatus according to claim 50, wherein the second electrode comprises Mg and Ag.

52. The light emitting apparatus according to claim 50, wherein the third electrode is above the first electrode.

53. The light emitting apparatus according to claim 50, wherein the third electrode is not connected to the first electrode.

54. The light emitting apparatus according to claim 50, wherein the first electrode is a single layer.

55. The light emitting apparatus according to claim 50, wherein the second electrode is a single layer.

56. The light emitting apparatus according to claim 50, wherein the light emitting apparatus is selected from the group consisting of a video camera, a digital camera, a goggle type display, a car navigation apparatus, a personal computer and a portable information terminal.

57. The light emitting apparatus according to claim 50, wherein the organic compound of the first layer and the organic compound of the second layer are the same.

58. The light emitting apparatus according to claim 50,
wherein the upper end portion of the insulating substance has a first radius of curvature, and
wherein the lower end portion of the insulating substance has a second radius of curvature.

59. The light emitting apparatus according to claim 50,
wherein the upper end portion of the insulating substance has a first radius of curvature,
wherein the lower end portion of the insulating substance has a second radius of curvature, and
wherein the first radius of curvature and the second radius of curvature is in a range of 0.2μm though 3μm.

60. A light emitting apparatus comprising a drive circuit, a terminal portion and a pixel portion, the pixel portion comprising a first luminescent element and a second luminescent element over a substrate,
wherein the first luminescent element comprises a first electrode, a first layer comprising an organic compound over the first electrode, and a part of a second electrode over the layer comprising the organic compound,
wherein the second luminescent element comprises a fourth electrode, a second layer comprising an organic compound over the fourth electrode, and a part of the second electrode over the second layer comprising the organic compound,
wherein an insulating substance is over an end portion of the first electrode and an end portion of the fourth electrode,
wherein upper and lower end portions of a side face of the insulating substance are round,
wherein a third electrode is between the first and second luminescent elements, and
wherein the insulating substance is in contact with a part of the first layer comprising the organic compound and a part of the second layer comprising the organic compound.

61. The light emitting apparatus according to claim 60, wherein the second electrode comprises Mg and Ag.

62. The light emitting apparatus according to claim 60, wherein the third electrode is above the first electrode.

63. The light emitting apparatus according to claim 60, wherein the third electrode is not connected to the first electrode.

64. The light emitting apparatus according to claim 60, wherein the first electrode is a single layer.

65. The light emitting apparatus according to claim 60, wherein the second electrode is a single layer.

66. The light emitting apparatus according to claim 60, wherein the light emitting apparatus is selected from the group consisting of a video camera, a digital camera, a goggle type display, a car navigation apparatus, a personal computer and a portable information terminal.

67. The light emitting apparatus according to claim 60, wherein the organic compound of the first layer and the organic compound of the second layer are the same.

68. The light emitting apparatus according to claim 60,
wherein the upper end portion of the insulating substance has a first radius of curvature, and
wherein the lower end portion of the insulating substance has a second radius of curvature.

69. The light emitting apparatus according to claim 60,
wherein the upper end portion of the insulating substance has a first radius of curvature,
wherein the lower end portion of the insulating substance has a second radius of curvature, and
wherein the first radius of curvature and the second radius of curvature is in a range of 0.2μm through 3μm.

* * * * *